(12) United States Patent
Yamaguchi

(10) Patent No.: US 10,096,510 B2
(45) Date of Patent: Oct. 9, 2018

(54) SEMICONDUCTOR DEVICE AND METHOD OF MANUFACTURING SAME

(71) Applicant: RENESAS ELECTRONICS CORPORATION, Tokyo (JP)

(72) Inventor: Tadashi Yamaguchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/916,615

(22) Filed: Mar. 9, 2018

(65) Prior Publication Data

US 2018/0197768 A1 Jul. 12, 2018

Related U.S. Application Data

(62) Division of application No. 14/683,594, filed on Apr. 10, 2015, now Pat. No. 9,953,858.

(30) Foreign Application Priority Data

Apr. 14, 2014 (JP) .................................. 2014-083003

(51) Int. Cl.
*H01L 21/764* (2006.01)
*H01L 21/762* (2006.01)
(Continued)

(52) U.S. Cl.
CPC .. *H01L 21/76224* (2013.01); *H01L 21/02164* (2013.01); *H01L 21/02271* (2013.01);
(Continued)

(58) Field of Classification Search
None
See application file for complete search history.

(56) References Cited

U.S. PATENT DOCUMENTS

| 6,121,113 A | 9/2000 | Takatsuka et al. |
| 6,291,312 B1 | 9/2001 | Chan et al. |

(Continued)

FOREIGN PATENT DOCUMENTS

| JP | 11-074340 A | 3/1999 |
| JP | 2002-083866 A | 3/2002 |

(Continued)

OTHER PUBLICATIONS

Office Action issued in corresponding Japanese Patent Application No. 2014-083003, dated Sep. 5, 2017.
(Continued)

*Primary Examiner* — Charles Garber
*Assistant Examiner* — Alia Sabur
(74) *Attorney, Agent, or Firm* — McDermott Will & Emery LLP

(57) ABSTRACT

To provide a semiconductor device having improved performance. The semiconductor device has a first insulating film formed on the main surface of a semiconductor substrate and a second insulating film formed on the first insulating film. The semiconductor device further has a first opening portion penetrating through the second insulating film and reaching the first insulating film, a second opening portion penetrating through the first insulating film and reaching the semiconductor substrate, and a trench portion formed in the semiconductor substrate. A first opening width of the first opening portion and a second opening width of the second opening portion are greater than a trench width of the trench portion. The trench portion is closed by a third insulating film while leaving a space in the trench portion.

9 Claims, 37 Drawing Sheets

(51) Int. Cl.
| | |
|---|---|
| *H01L 21/308* | (2006.01) |
| *H01L 21/02* | (2006.01) |
| *H01L 27/092* | (2006.01) |
| *H01L 21/8238* | (2006.01) |
| *H01L 29/10* | (2006.01) |
| *H01L 29/78* | (2006.01) |
| *H01L 29/66* | (2006.01) |
| *H01L 29/423* | (2006.01) |

(52) U.S. Cl.
CPC .... *H01L 21/02274* (2013.01); *H01L 21/3081* (2013.01); *H01L 21/764* (2013.01); *H01L 21/823814* (2013.01); *H01L 21/823878* (2013.01); *H01L 27/0922* (2013.01); H01L 21/823807 (2013.01); H01L 29/1045 (2013.01); H01L 29/42368 (2013.01); H01L 29/665 (2013.01); H01L 29/66659 (2013.01); H01L 29/7833 (2013.01); H01L 29/7835 (2013.01)

(56) References Cited

U.S. PATENT DOCUMENTS

| | | | |
|---|---|---|---|
| 7,736,991 | B2 | 6/2010 | Dong et al. |
| 8,357,989 | B2 | 1/2013 | Onishi et al. |
| 8,569,839 | B2 | 10/2013 | Morii et al. |
| 2007/0042564 | A1* | 2/2007 | Yoon ................ H01L 21/76232 438/424 |
| 2007/0155128 | A1 | 7/2007 | Choi |
| 2007/0284692 | A1 | 12/2007 | Lee et al. |
| 2008/0102579 | A1 | 5/2008 | Dong et al. |
| 2011/0175205 | A1* | 7/2011 | Morii ................ H01L 21/76232 257/618 |

FOREIGN PATENT DOCUMENTS

| | | |
|---|---|---|
| JP | 2008-118084 A | 5/2008 |
| JP | 2011-066067 A | 3/2011 |
| JP | 2011-151121 A | 8/2011 |
| JP | 2013-222838 A | 10/2013 |

OTHER PUBLICATIONS

Non-Final Office Action issued in corresponding parent U.S. Appl. No. 14/683,594, dated Jun. 5, 2017.
Non-Final Office Action issued in corresponding parent U.S. Appl. No. 14/683,594, dated Aug. 4, 2016.
Final Office Action issued in corresponding parent U.S. Appl. No. 14/683,594, dated Feb. 2, 2017.
Notice of Allowance issued in corresponding parent U.S. Appl. No. 14/683,594, dated Dec. 13, 2017.

* cited by examiner

SEMICONDUCTOR DEVICE AND METHOD OF MANUFACTURING SAME

CROSS-REFERENCE TO RELATED APPLICATIONS

This is a divisional of U.S. patent application Ser. No. 14/683,594 filed on Apr. 10, 2015, which claims the benefit of Japanese Patent Application No. 2014-083003 filed on Apr. 14, 2014 including the specification, drawings and abstract is incorporated herein by reference in its entirety.

BACKGROUND

The present invention relates to a semiconductor device and a method of manufacturing the same and can be suitably used for, for example, a semiconductor device having a trench portion and a method of manufacturing the device.

There is a semiconductor device having an element isolation structure obtained by forming an insulating film in a trench portion formed in a surface as the main surface of a semiconductor substrate. There is also a semiconductor device having an element isolation (deep trench isolation: DTI) structure obtained by forming an insulating film in a trench portion having, as an aspect ratio, that is, a ratio of the depth of the trench portion to the width of the trench portion, an aspect ratio as high as 1 or more.

Japanese Patent Laid-Open No. 2011-66067 (Patent Document 1) discloses a semiconductor device equipped with a trench formed in the main surface of a semiconductor substrate so as to surround, in a plan view, an element formed on the main surface of the semiconductor substrate and an insulating film formed on the element and in the trench; and a method of manufacturing the semiconductor device. According to the technology described in Patent Document 1, the insulating film is formed so as to cover the upper portion of the element and at the same time, to create a space in the trench.

Japanese Patent Laid-Open No. 2013-222838 (Patent Document 2) and Japanese Patent Laid-Open No. 2011-151121 (Patent Document 3) disclose a semiconductor device equipped with a semiconductor substrate having a support board, a buried insulating film, and a semiconductor layer stacked one after another in order of mention, a trench formed in the main surface of the semiconductor layer, and an insulating film formed in the trench; and a method of manufacturing the semiconductor device. According to the technology described in Patent Document 2 and the technology described in Patent Document 3, the trench is formed so as to surround, in plan view, an element formed on the main surface of the semiconductor layer. According to the technology described in Patent Document 2 and the technology described in Patent Document 3, the insulating film is formed so as to cover the upper portion of the element and at the same time, to create a space in the trench.

PATENT DOCUMENTS

[Patent Document 1] Japanese Patent Laid-Open No. 2011-66067
[Patent Document 2] Japanese Patent Laid-Open No. 2013-222838
[Patent Document 3] Japanese Patent Laid-Open No. 2011-151121

SUMMARY

When an insulating film is formed in a trench portion having a high aspect ratio, the trench portion is sometimes closed by an insulating film formed from a silicon oxide, for example, by chemical vapor deposition (CVD) while leaving a space inside the trench portion. In this case, the thickness of the insulating film formed on the upper side surface of the trench portion is likely to be greater than that of the insulating film formed on the bottom side surface of the trench portion. By forming an insulating film on the side surface of the trench portion, therefore, the trench portion can be closed while leaving a space in the trench portion. Compared with a trench portion having no space therein, a trench portion having a space therein has improved element isolation characteristics when element isolation is achieved by insulating between elements by a DTI structure.

When an insulating film is formed from a silicon oxide film by CVD, on the other hand, it is difficult to precisely adjust the closing position, that is, a height position of an upper end of the space left inside the trench portion to a desired height position. The closing position of the space left inside the trench portion may become higher than the desired position.

When the closing position of the space becomes higher than the desired position, at the time of forming an insulating film and then planarizing the surface of the insulating film, for example, by polishing, the height position of the surface of the insulating film becomes lower than the closing position of the space and a polishing slurry may enter the space exposed from the surface of the insulating film or a washing liquid may enter this space in a washing step to be performed later. The slurry or washing liquid that has entered the space may blow out from the space and become a foreign matter. The semiconductor device thus obtained may have a defect in the shape thereof and therefore have deteriorated performance.

The other problem and a novel feature will be apparent from the description herein and accompanying drawings.

According to one embodiment, a semiconductor device has a first insulating film formed on the main surface of a semiconductor substrate and containing silicon and oxygen and a second insulating film formed on the first insulating film. The semiconductor device further has a first opening portion penetrating through the second insulating film and reaching the first insulating film, a second opening portion penetrating through a portion of the first insulating film exposed from the first opening portion and reaching the semiconductor substrate, and a trench portion formed in a portion of the semiconductor substrate exposed from the second opening portion. The second insulating film is made of a material different from that of the first insulating film. The opening width of the first opening portion and the opening width of the second opening portion are each greater than the trench width of the trench portion. The trench portion is closed with a third insulating film while leaving a space inside the trench portion.

According to another embodiment, a method of manufacturing a semiconductor device includes forming a first insulating film containing silicon and oxygen on the main surface of a semiconductor substrate, forming a second insulating film on the first insulating film, forming a first opening portion penetrating through the second insulating film and reaching the first insulating film, forming a second opening portion penetrating through the first insulating film and reaching the semiconductor substrate in a region having therein the first opening portion in plan view, forming a trench portion in a portion of the semiconductor substrate exposed from the second opening portion, etching a portion of the first insulating film exposed from the second opening portion to widen the second opening width of the second opening portion so as to be greater than the trench width of the trench portion, and then closing the trench portion by a third insulating film while leaving a space inside the trench portion.

According to the embodiment, a semiconductor device having improved performance can be provided.

DETAILED DESCRIPTION

Figure 1:
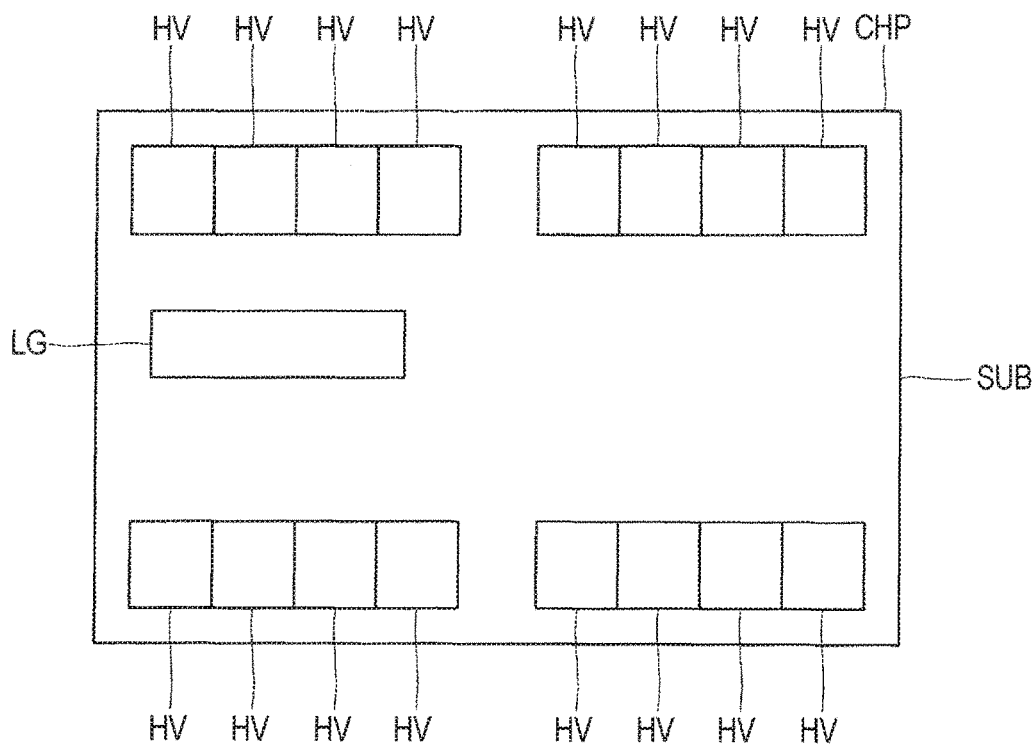
FIG. 1 is a plan view showing the configuration of a semiconductor device of First Embodiment.

In the below-described embodiments, a description may be made after divided in a plurality of sections or embodiments if necessary for the sake of convenience. These sections or embodiments are not independent from each other unless otherwise particularly specified, but one of them may be a modification example, details, complementary description, or the like of a part or whole of the other one.

In the below-described embodiments, when a reference is made to the number of elements (including the number, value, amount, range, or the like), the number is not limited to a specific number but may be more or less than the specific number, unless otherwise particularly specified or principally apparent that the number is limited to the specific number.

Further, it is needless to say that in the below-described embodiments, the constituent component (including constituent step or the like) is not always essential unless otherwise particularly specified or principally apparent that it is essential. Similarly, in the below-described embodiments, when a reference is made to the shape, positional relationship, or the like of the constituent component, that substantially approximate or analogous to it is also embraced unless otherwise particularly specified or principally apparent that it is not. This also applies to the above-described value and range.

Embodiments will hereinafter be described in detail based on drawings. In all the drawings for describing the embodiments, members of a like function will be identified by like reference numerals and overlapping descriptions will be omitted. In the below-described embodiments, a description on the same or similar portion is not repeated in principle unless otherwise particularly necessary.

In the drawings to be used in the following embodiments, even a cross-sectional view is sometimes not hatched to facilitate understanding of it.

First Embodiment

<Configuration of Semiconductor Device>

Figure 2:
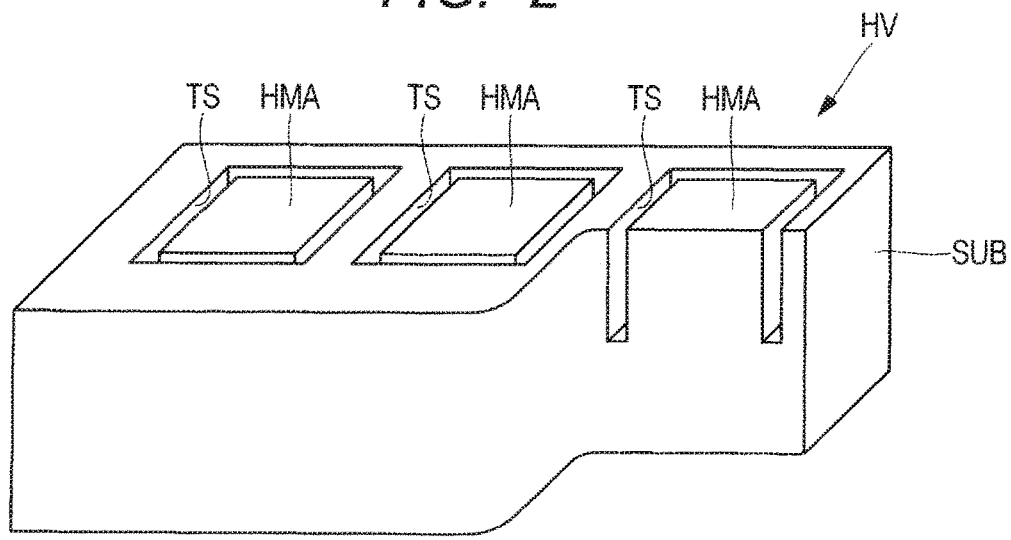
FIG. 2 is a partially cutaway perspective view showing the configuration of the semiconductor device of First Embodiment.
Figure 3:
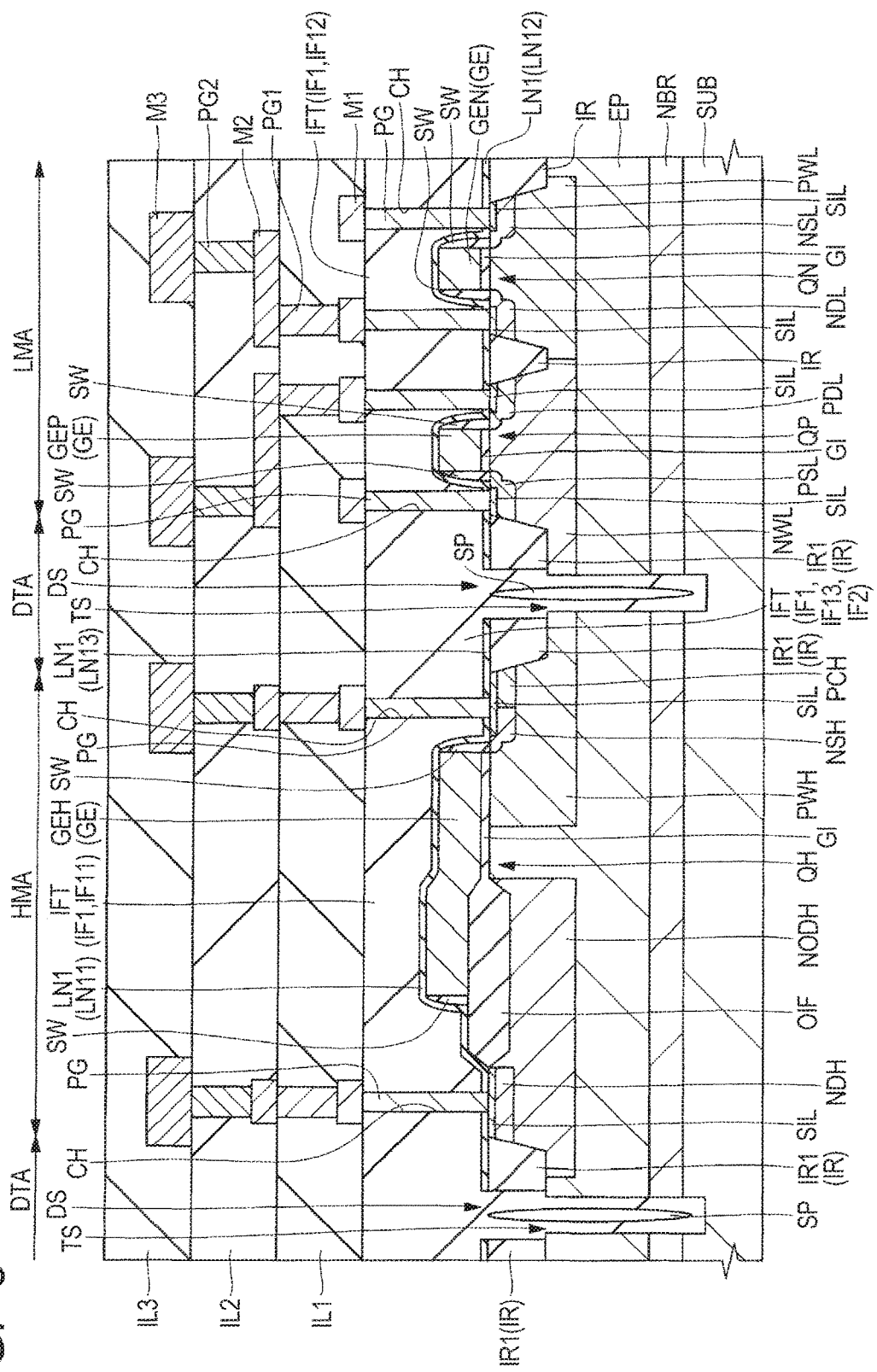
FIG. 3 is a fragmentary cross-sectional view showing the configuration of the semiconductor device of First Embodiment.
Figure 4:
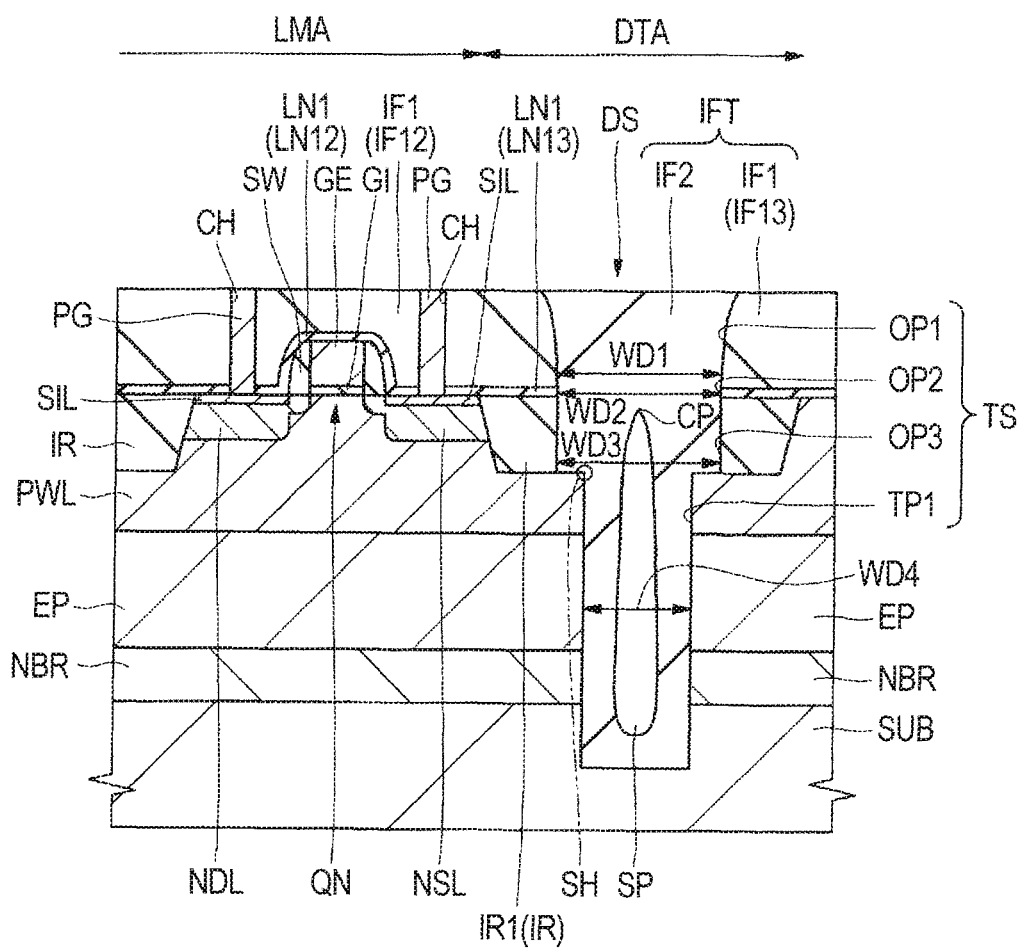
FIG. 4 is a fragmentary cross-sectional view showing the configuration of the semiconductor device of First Embodiment.

First, the configuration of a semiconductor device of First Embodiment will be described. FIG. 1 is a plan view showing the configuration of the semiconductor device of First Embodiment. FIG. 2 is a partially cutaway perspective view showing the configuration of the semiconductor device of First Embodiment. FIGS. 3 and 4 are fragmentary cross-sectional views showing the configuration of the semiconductor device of First Embodiment. FIG. 4 is an enlarged cross-sectional view showing the configuration around a DTI structure.

To facilitate understanding, FIG. 4 shows an example of a DTI structure DS formed near one n channel MISFETQN. As shown in FIG. 3, however, the DTI structure DS may be formed between a LDMOSFETQH and a p channel MISFETQP or may be formed near various other elements.

Portions above an insulating film IFT are omitted from FIG. 4 to facilitate understanding of this drawing.

As shown in FIG. 1, the semiconductor device of First Embodiment is a BiC-DMOS (bipolar complementary double-diffused metal oxide semiconductor) semiconductor chip CHP. The semiconductor chip CHP has, for example, a semiconductor substrate SUB, an output driver portion HV, and a logic portion LG. The output driver portion HV includes a high breakdown voltage MOS transistor formed on the semiconductor substrate SUB. The logic portion LG includes a low breakdown voltage CMOS (complementary metal oxide semiconductor) transistor formed on the semiconductor substrate SUB. As will be described later referring to FIG. 3, a region in which the high breakdown voltage MOS transistor is to be formed is called "high breakdown voltage MOS region HMA", while a region in which the low breakdown voltage MOS transistor is to be formed is called "low breakdown voltage MOS region LMA".

In First Embodiment, a formation example of a laterally diffused MOSFET (laterally diffused metal oxide semiconductor field effect transistor; LDMOSFET) as the high breakdown voltage MOS transistor will be described. In First Embodiment, also a formation example of a CMOS transistor comprised of a p channel MISFET (metal insulator semiconductor field effect transistor) and an n channel MISFET as the low breakdown voltage MOS transistor will be described.

The term "MOSFET" or "LDMOSFET" as used herein embraces not only a MISFET having as a gate insulating film thereof an oxide film but also a MISFET having as a gate insulating film thereof an insulating film other than an oxide film.

As shown in FIG. 2, in the output driver portion HV, the high breakdown voltage MOS region HMA in which a high breakdown voltage MOS transistor is to be formed is surrounded, in plan view, with a trench structure TS included in the DTI structure. The trench structure TS is formed in the surface, as the main surface, of the semiconductor substrate SUB. Although not shown in FIG. 2, in the logic portion LG, the low breakdown voltage MOS region LMA (refer to FIG. 3) in which a low breakdown voltage MOS transistor is to be formed may be surrounded, in plan view, with the trench structure TS configuring the DTI structure.

The term "in plan view" as used herein means a view from a direction perpendicular to the surface, as the main surface, of the semiconductor substrate SUB.

As shown in FIG. 3, the semiconductor device of First Embodiment has a semiconductor substrate SUB having a high breakdown voltage MOS region HMA, a low breakdown voltage MOS region LMA, and a DTI region DTA between the high breakdown voltage MOS region HMA and the low breakdown voltage MOS region LMA. The semiconductor substrate SUB is made of, for example, p type single crystal silicon (Si). In the DTI region (DTA), the semiconductor substrate SUB has a trench structure TS in the surface, as the main surface, of the semiconductor substrate. The trench structure TS has therein an insulating film IFT. The trench structure TS and the insulating film IFT configure a DTI structure DS.

The insulating film IFT includes insulating films IF1 and IF2. Of these, the insulating film IF1 is formed outside the trench structure TS and the insulating film IF2 is formed inside the trench structure TS. Therefore, the trench structure TS and the insulating film IF2 configure the DTI structure DS. FIG. 3 shows the insulating film IF1 and the insulating film IF2 as one body as the insulating film IFT.

As shown in FIG. 3, in the high breakdown voltage MOS region HMA and the low breakdown voltage MOS region LMA, the semiconductor substrate SUB has, on the side of the surface as a main surface thereof, an n type buried region NBR and the n type buried region NBR has thereon a p⁻ type epitaxial layer EP.

In the high breakdown voltage MOS region HMA, the low breakdown voltage MOS region LMA, and the DTI region DTA, the semiconductor substrate SUB has, on the surface as a main surface thereof, that is, on the surface of the p⁻ type epitaxial layer EP, an insulating film as an element isolation region IR. The insulating film as the element isolation region IR contains silicon and oxygen. The insulating film as the element isolation region IR electrically isolates semiconductor elements such as various MOS transistors, which will be described later, from each other.

The insulating film as the element isolation region IR is preferably made of a silicon oxide film. This facilitates formation of an insulating film having a high insulation property on the surface of the semiconductor substrate SUB made of, for example, p type single crystal silicon.

In the DTI region DTA, the insulating film formed on the surface of the semiconductor substrate SUB as the element isolation region IR will hereinafter be called "insulating film IR1".

In the high breakdown voltage MOS region HMA, the p⁻ type epitaxial layer EP has on the surface thereof, in other words, the semiconductor substrate SUB has on the surface thereof a LDMOSFETQH as a high breakdown voltage MOS transistor. The LDMOSFETQH has the p⁻ type epitaxial layer EP, a p type well region PWH, an n⁺ type source region NSH, an n type offset drain region NODH, an n⁺ type drain region NDH, a gate insulating film GI, and a gate electrode GE.

The LDMOSFET has a heavily doped drain region on the drain side thereof via a lightly doped offset drain region so that it has a structure capable of securing a high drain breakdown voltage. The n type impurity concentration in the n⁺ type drain region NDH is therefore higher than the n type impurity concentration in the n type offset drain region NODH. The gate electrode GE of the LDMOSFETQH will hereinafter be called "gate electrode GEH".

The p type well region PWH lies in the upper layer portion of the p⁻ type epitaxial layer EP. The n⁺ type source region NSH lies in the upper layer portion of the p type well region PWH. The n⁺ type source region NSH and the p type well region PWH together form a pn junction.

The n type offset drain region NODH lies in the upper layer portion of the p⁻ type epitaxial layer EP. The n type offset drain region NODH and the p⁻ type epitaxial layer EP together form a pn junction. The n⁺ type drain region NDH lies in the upper layer portion of the n type offset drain region NODH.

The n type offset drain region NODH lies at a position, in plan view, distant from the p type well region PWH. The n⁺ type source region NSH and the n type offset drain region NODH have therebetween the p type well region PWH and the p⁻ type epitaxial layer EP along the surface of the semiconductor substrate SUB.

A source-side portion of the gate electrode GEH lies on the p type well region PWH and the p⁻ type epitaxial layer EP sandwiched between the n⁺ type source region NSH and the n type offset drain region NODH via the gate insulating film GI. A drain-side portion of the gate electrode GEH lies so as to get on an offset insulating film OIF formed on the surface of the n type offset drain region NODH. A sidewall spacer SW lies so as to cover the side wall of the gate electrode GEH.

A p⁺ type contact region PCH lies in an upper layer portion of the p type well region PWH and on the side opposite to the gate electrode GEH with the n⁺ type source region NSH therebetween. The p⁺ type contact region PCH serves to control the potential of, for example, the p type well region PWH.

The n⁺ type source region NSH, the n⁺ type drain region NDH, and the p⁺ type contact region PCH have on the respective surfaces thereof, a silicide layer SIL. The silicide layer SIL is a conductor portion included in the LDMOSFETQH. Although not illustrated, the gate electrode GEH may have, on the surface thereof, a silicide layer. Any of the n⁺ type source region NSH, the n⁺ type drain region NDH, and the p⁺ type contact region PCH is not required to have, on the surface thereof, the silicide layer SIL.

In the low breakdown voltage MOS region LMA, the p⁻ type epitaxial layer EP has on the surface thereof, in other words, the semiconductor substrate SUB has on the surface thereof a p channel MISFETQP and an n channel MISFETQN as a low breakdown voltage MOS transistor. The p channel MISFETQP and the n channel MISFETQN configure a CMOS transistor.

The p channel MISFETQP has an n type well region NWL, a p⁺ type source region PSL, a p⁺ type drain region PDL, a gate insulating film GI, and a gate electrode GE. The gate electrode GE of the p channel MISFETQP will hereinafter be called "gate electrode GEP".

The n type well region NWL lies, in a portion of the low breakdown voltage MOS region LMA in which the p channel MISFETQP is to be formed, on an upper layer portion of the p⁻ type epitaxial layer EP. The p⁺ type source region PSL and the p⁺ type drain region PDL are formed in the an upper layer portion of the n type well region NWL while being separated from each other.

The gate electrode GEP of the p channel MISFETQP lies on a portion of the n type well region NWL sandwiched between the p⁺ type source region PSL and the p⁺ type drain region PDL via the gate insulating film GI. A sidewall spacer SW covers the side wall of the gate electrode GEP.

The p⁺ type source region PSL and the p⁺ type drain region PDL each have, on the surface thereof, a silicide layer SIL. The silicide layer SIL is a conductor portion included in the p channel MISFETQP. Although not illustrated, the gate electrode GEP may have, on the surface thereof, a silicide layer. Either one of the p⁺ type source region PSL and the p⁺ type drain region PDL is not required to have, on the surface thereof, the silicide layer SIL.

The n channel MISFETQN has a p type well region PWL, an n⁺ type source region NSL, an n⁺ type drain region NDL, a gate insulating film GI, and a gate electrode GE. The gate electrode GE of the n channel MISFETQN will hereinafter be called "gate electrode GEN".

The p type well region PWL is formed in the upper layer portion of the p⁻ type epitaxial layer EP in a portion of the low breakdown voltage MOS region LMA in which the n channel MISFETQN is to be formed. The p type well region PWL is formed at a position distant from the n type well region NWL in plan view. The n⁺ type source region NSL and the n⁺ type drain region NDL are formed in the upper layer portion of the p type well region PWL, while being separated from each other.

The gate electrode GEN of the n channel MISFETQN lies on a portion of the p type well region PWL sandwiched between the n⁺ type source region NSL and the n⁺ type drain region NDL via the gate insulating film GI. A sidewall spacer SW covers the side wall of the gate electrode GEN therewith.

The n+ type source region NSL and the n+ type drain region NDL each have on the surface thereof a silicide layer SIL. The silicide layer SIL is a conductor portion included in the n channel MISFETQN. Although not illustrated, the gate electrode GEN may have on the surface thereof a silicide layer. Either one of the n+ type source region NSL and the n+ type drain region NDL is not required to have, on the surface thereof, the silicide layer SIL.

The LDMOSFETQH, the p channel MISFETQP, and the n channel MISFETQN are covered with an insulating film LN1. In the DTI region DTA, the insulating film IR1 as the element isolation region IR also has thereon the insulating film LN1.

In the high breakdown voltage MOS region HMA, the insulating film LN1 formed to cover the LDMOSFETQH therewith will hereinafter be called "insulating film LN11". In the low breakdown voltage MOS region LMA, the insulating film LN1 formed to cover the p channel MISFETQP and the n channel MISFETQN will hereinafter be called "insulating film LN12". Further, in the DTI region DTA, the insulating film LN1 formed on the insulating film IR1 as the element isolation region IR will hereinafter be called "insulating film LN13". These insulating films LN11, LN12, and LN13 are formed as the same layer.

The insulating film LN1 is made of a material different from that of the insulating film IR1. An etch rate of the insulating film LN1 by an etching agent, which is to be used for etching of the insulating film IR1 as the element isolation region IR, can therefore be made smaller than an etch rate of the insulating film IR1 by this etching agent. This enables to selectively etch the insulating film IR1 without etching the insulating film LN1.

The insulating film LN1 has thereon an insulating film IF1. The insulating film IF1 covers, via the insulating film LN1, the LDMOSFETQH, the p channel MISFETQP, and the n channel MISFETQN. The insulating film IF1 covers, via the insulating film LN1, the insulating film IR1 as the element isolation region IR. The insulating film IF1 contains silicon and oxygen.

The insulating film IF1 is preferably made of a silicon oxide film. This facilitates the formation of an insulating film having a high insulation property so as to cover therewith, for example, the LDMOSFETQH, the p channel MISFETQP, and the n channel MISFETQN.

The insulating IF1 formed to cover the LDMOSFETQH via the insulating film LN1 in the high breakdown voltage MOS region HMA will hereinafter be called "insulating film IF11. The insulating film IF1 formed to cover the p channel MISFETQP and the n channel MISFETQN via the insulating film LN1 in the low breakdown voltage MOS region LMA will hereinafter be called "insulating film IF12". Further, the insulating film IF1 formed via the insulating film LN1 on the insulating film IR1 as the element isolation region IR in the DTI region DTA will hereinafter be called "insulating film IF13. These insulating films IF11, IF12, and IF13 are formed as the same layer.

The insulating film IF1, similar to the insulating film IR1, contains silicon and oxygen. As an etching agent for the insulating film IF1, therefore, an etching agent of the same kind as that of the etching agent for the insulating film IR1 can be used.

The insulating film LN1 is made of a material different from that of the insulating film IF1. An etch rate of the insulating film LN1 by an etching agent to be used for etching of the insulating film IF1 can therefore be made smaller than an etch rate of the insulating film IF1 by this etching agent. By using an etching agent of the same kind as that for etching of the insulating film IR1, the insulating film IF1 can be etched selectively without etching the insulating film LN1.

When the insulating films IR1 and IF1 each contain silicon and oxygen, the insulating film LN1 preferably contains silicon and nitrogen. When the insulating films IR1 and IF1 are each made of a silicon oxide film, the insulating film LN1 is preferably made of a silicon nitride film or a silicon oxynitride film. This makes it possible to make the etch rate of the insulating film LN1 by an etching agent, which is to be used for etching of the insulating films IR1 and IF1, smaller than the etch rate of each of the insulating films IR1 and IF1 by this etching agent.

When the insulating films IR1 and IF1 each contain silicon and oxygen, a hydrofluoric acid-containing etchant can be used as an etching agent to be used for etching of the insulating films IR1 and IF1. An etch rate of the insulating film LN1 by the hydrofluoric acid-containing etchant is far smaller than that of the insulating films IR1 and IF1 by the etchant. It therefore facilitates selective etching of the insulating films IR1 and IF1 without etching the insulating film LN1.

The DTI structure DS surrounds the LDMOSFETQH therewith in plan view. As described above, the DTI structure DS has the trench structure TS formed on the surface, as the main surface, of the semiconductor substrate SUB and the insulating film IF2 formed in the trench structure TS.

As shown in FIG. 4, the trench structure TS has an opening portion OP1, an opening portion OP2, an opening portion OP3, and a trench portion TP1. The opening portion OP1 penetrates through the insulating film IF1 and reaches the upper surface of the insulating film LN1. The opening portion OP2 penetrates through a portion of the insulating film LN1 exposed from the bottom surface of the opening portion OP1 and reaches the upper surface of the insulating film IR1 as the element isolation region IR. The opening portion OP3 penetrates through a portion of the insulating film IR1 exposed from the bottom surface of the opening portion OP2 and reaches the p− type epitaxial layer EP including, for example, the p type well region PWL in the semiconductor substrate SUB. The trench portion TP1 is in a portion of the semiconductor substrate SUB exposed from the bottom surface of the opening portion OP3. The trench portion TP1 penetrates through, for example, the p type well region PWL, the p− type epitaxial layer EP, and the n type buried region NBR and reaches a portion of the semiconductor substrate SUB below the n type buried region NBR. The opening portions OP1, OP2, and OP3 and the trench portion TP1 are placed in order of mention from top down. The upper end of the opening portion OP2 is communicated with the lower end of the opening portion OP1, the upper end of the opening portion OP3 is communicated with the lower end of the opening portion OP2, and the upper end of the trench portion TP1 is communicated with the lower end of the opening portion OP3.

The trench structure TS therefore penetrates through the insulating film IF1, the insulating film LN1, the insulating film IR1 as the element isolation region IR, the p− type epitaxial layer EP including, for example, the p type well region PWL, and the n type buried region NBR and reaches a portion of the semiconductor substrate SUB below the n type buried region NBR.

The DTI structure DS may surround one or more of the p channel MISFETQP and the n channel MISFETQN in plan view.

The trench structure TS has inside thereof the insulating film IF2. This means that the insulating film IF2 lies inside the trench portion TP1, inside the opening portion OP3, inside the opening portion OP2, and inside the opening portion OP1. The trench structure TS is closed by the insulating film IF2 while leaving a space SP inside the trench structure TS. This means that the trench structure TS is not completely filled with the insulating film IF2 and has the space SP in the trench structure TS. At this time, at least the trench portion TP1 is closed by the insulating film IF2 while leaving the space SP inside the trench portion TP1.

The space SP formed inside the trench structure TS can decrease a leakage current of the elements separated by the DTI structure DS, increase a breakdown voltage, and at the same time, relax an electric field intensity at a position contiguous to the trench structure TS. When the high breakdown voltage MOS region HMA has therein LDMOSFETQHs as First Embodiment, the above-mentioned effect of decreasing a leakage current of LDMOSFETQHs separated by the DTI structure DS, increasing a breakdown voltage, and relaxing an electric field intensity at a position contiguous to the trench structure TS can be enhanced further.

In addition, the space SP formed in the trench structure TS can suppress the action of an electric field from an adjacent element so as to impede the extension of a depletion layer, that is, to suppress a reverse field plate effect, resulting in enhancement of separation breakdown voltage. Further, the space SP formed in the trench portion TP can reduce a stress in the trench structure TS and therefore can suppress generation of crystal defects due to the stress.

In First Embodiment, the trench structure TS lies in a region overlapping, in plan view, with the insulating film IR1 as the element isolation region IR. The element isolation region IR therefore has the DTI structure DS therein so that stress concentration on the upper portion of the trench portion TP1 can be relaxed and generation of crystal defects can be suppressed further.

The opening width of the opening portion OP1 will hereinafter be called "opening width WD1", the opening width of the opening portion OP2 will hereinafter be called "opening width WD2", the opening width of the opening portion OP3 will hereinafter be called "opening width WD3", and the trench width of the trench portion TP1 will hereinafter be called "trench width WD4". At this time, the opening widths WD1, WD2, and WD3 are each greater than the trench width WD4. This makes it possible to lower the height position of the upper end of a portion of the trench structure TS equal to the trench width WD4 or having a trench width smaller than that of the trench width WD4, in other words, the height position of a shoulder portion SH, to the height position of the lower surface of the insulating film IR1. The higher the height position of this shoulder portion SH, the higher the height position of the space SP at which closing thereof starts at the time of the formation of the insulating film IF2. By lowering the height position of the shoulder portion SH, the height position of the space SP at which closing thereof starts can be lowered at the time of the formation of the insulating film IF2 so that the height position of the upper end of the space SP can be lowered.

Here, the height position of the upper end of the space SP is defined as "closing position CP of the space SP". By lowering the height position of the shoulder portion SH, the closing position CP of the space SP can be lowered.

The side surface of the opening portion OP1 is sometimes tilted relative to a plane perpendicular to the main surface of the semiconductor substrate SUB because the opening width at the upper end of the opening portion OP1 becomes greater than the opening width at the lower end of the opening portion OP1. In such a case, an opening width at the lower end of the opening portion OP1 is regarded as the opening width WD1 of the opening portion OP1.

When the opening width WD1 is greater than the trench width WD4, the side surface of a portion of the insulating film IF1 exposed to the inside of the opening portion OP1 retreats from the side surface of a portion of the semiconductor substrate SUB exposed to the inside of the trench portion TP1 in the direction of the opening width WD1. This means that the side surface of the opening portion OP1 retreats outward from the side surface of the trench portion TP1 in the direction of the opening width WD1.

When the opening width WD2 is greater than the trench width WD4, the side surface of a portion of the insulating film LN1 exposed to the inside of the opening portion OP2 retreats from the side surface of a portion of the semiconductor substrate SUB exposed to the inside of the trench portion TP1 in the direction of the opening width WD2. This means that the side surface of the opening portion OP2 retreats outward from the side surface of the trench portion TP1 in the direction of the opening width WD2.

When the opening width WD3 is greater than the trench width WD4, the side surface of a portion of the insulating film IR1 exposed to the inside of the opening portion OP3 retreats from the side surface of a portion of the semiconductor substrate SUB exposed to the inside of the trench portion TP1 in the direction of the opening width WD3. This means that the side surface of the opening portion OP3 retreats outward from the side surface of the trench portion TP1 in the direction of the opening width WD3.

Preferably, the opening width WD1 of the opening portion OP1 is equal to the opening width WD2 of the opening portion OP2 or greater than the opening width WD2 of the opening portion OP2; and the opening width WD3 of the opening portion OP3 is equal to the opening width WD2 of the opening portion OP2 or greater than the opening width WD2 of the opening portion OP2. This makes it possible to, in the manufacturing steps of a semiconductor device described later, prevent or suppress fluctuation in the minimum opening width of the opening portions OP1, OP2, and OP3 among a plurality of the DTI structures DS at the time of increasing the opening width WD1 of the opening portion OP1 and the opening width WD3 of the opening portion OP3, leading to improvement in shape accuracy.

When the opening width WD1 of the opening portion OP1 is greater than the opening width WD2 of the opening portion OP2, the side surface of a portion of the insulating film IF1 exposed to the inside of the opening portion OP1 retreats from the side surface of a portion of the insulating film LN1 exposed to the inside of the opening portion OP2 in the direction of the opening width WD1. In short, the side surface of the opening portion OP1 retreats outward from the side surface of the opening portion OP2 in the direction of the opening width WD1.

When the opening width WD3 of the opening portion OP3 is greater than the opening width WD2 of the opening portion OP2, the side surface of a portion of the insulating film IR1 exposed to the inside of the opening portion OP3 retreats from the side surface of a portion of the insulating film LN1 exposed to the inside of the opening portion OP2 in the direction of the opening width WD3. In short, the side surface of the opening portion OP3 retreats outward from the side surface of the opening portion OP2 in the direction of the opening width WD3.

A difference between the opening width WD2 of the opening portion OP2 and the trench width WD4 of the trench portion TP1 can be set at, for example, from 200 to 500 nm. By this difference, in the manufacturing step of a semiconductor device which will be described later referring to FIG. 16, an opening portion OR1 for forming the opening portion OP2 can be formed in a resist film PR1, for example, by carrying out overexposure with a photomask for forming the trench portion TP1.

The trench portion TP1, the opening portion OP3, the opening portion OP2, and the opening portion OP1 are closed by the insulating film IF2 while leaving the space SP inside the trench portion TP1, inside the opening portion OP3, inside the opening portion OP2, and inside the opening portion OP1 and the height position of the upper end of the space SP, that is, the closing position CP of the space SP is lower than the height position of the upper surface of the insulating film IF1. The closing position CP is therefore separated downward from the upper surface of the insulating film IF1. This therefore makes it possible to prevent or suppress the space SP from being exposed to the upper surface of the insulating film IF2 when after formation of the insulating film IF2 in the trench structure TS and on the insulating film IF1, a portion of the insulating film IF2 located at a height position higher than the upper surface of the insulating film IF1 is removed to planarize the insulating film IF1.

For example, when the thickness of the insulating film IF1 is 300 nm and the closing position CP of the space SP is lower than the height position of the upper surface of the insulating film IF1, the closing position CP of the space SP is lower than the height position higher by 300 nm above from the upper surface of the insulating film LN1.

Preferably, the trench portion TP1 and the opening portion OP3 are closed by the insulating film IF2 while leaving the space SP inside the trench portion TP1 and inside the opening portion OP3 and the height position of the upper end of the space SP, that is, the closing position CP of the space SP is lower than the height position of the lower surface of the insulating film LN1. The closing position CP therefore lowers further while being separated from the upper surface of the insulating film IF1. This therefore makes it possible to certainly prevent or suppress the space SP from exposing to the upper surface of the insulating film IF2 at the time when after formation of the insulating film IF2 in the trench structure TS and on the insulating film IF1, a portion of the insulating film IF2 located at a height position higher than the upper surface of the insulating film IF1 is removed to planarize the insulating film IF1.

The insulating films IF1 and LN1 have therein a contact hole CH and the contact hole CH has therein a plug PG. The contact hole CH is a hole portion penetrating through the insulating films IF1 and LN1 and reaching the upper surface of the silicide layer SIL as a conductor portion. The plug PG is a coupling electrode formed to fill the contact hole CH and electrically coupled to the silicide layer SIL.

In the high breakdown voltage MOS region HMA, an insulating film IF11 as the insulating film IF1 and an insulating film LN11 as the insulating film LN1 have therein a contact hole CH and the contact hole CH has therein a plug PG so as to fill therewith the contact hole CH. In the low breakdown voltage MOS region LMA, an insulating film IF12 as the insulating film IF1 and an insulating film LN12 as the insulating film LN1 have therein a contact hole CH and the contact hole CH has therein a plug PG so as to fill therewith the contact hole CH.

In the high breakdown voltage MOS region HMA, the plug PG is electrically coupled to each of the $n^+$ type source region NSH, the $n^+$ type drain region NDH, and the $p^+$ type contact region PCH via the silicide layer SIL. In the low breakdown voltage MOS region LMA, the plug PG is electrically coupled to each of the $p^+$ type source region PSL, the $p^+$ type drain region PDL, the $n^+$ type source region NSL, and the $n^+$ type drain region NDL via the silicide layer SIL.

Although not illustrated, in the high breakdown voltage MOS region HMA and the low breakdown voltage MOS region LMA, the plug PG is also electrically coupled to each of the gate electrodes GEH, GEP, and GEN.

As shown in FIG. 3, the insulating film IFT made of the insulating films IF1 and IF2 has thereon a first-layer wiring M1. The wiring M1 is electrically coupled to the plug PG in the contact hole CH. The insulating film IFT and also the first-layer wiring M1 each have thereon an interlayer insulating film IL1. The interlayer insulating film IL1 has therein a plug PG1 penetrating through the interlayer insulating film IL1 and reaching the wiring M1.

The interlayer insulating film IL1 has thereon a second-layer wiring M2. The wiring M2 is electrically coupled to the plug PG1 penetrating through the interlayer insulating film IL1. The interlayer insulating film IL1 and also the second-layer wiring M2 each have thereon an interlayer insulating film IL2. The interlayer insulating film IL2 has therein a plug PG2 penetrating through the interlayer insulating film IL2 and reaching the wiring M2.

The interlayer insulating film IL2 has thereon a third-layer wiring M3. The wiring M3 is electrically coupled to the plug PG2 penetrating through the interlayer insulating film IL2.

The interlayer insulating film IL2 and also the third-layer wiring M3 have thereon an interlayer insulating film IL3.

<Method of Manufacturing a Semiconductor Device>

Figure 5:
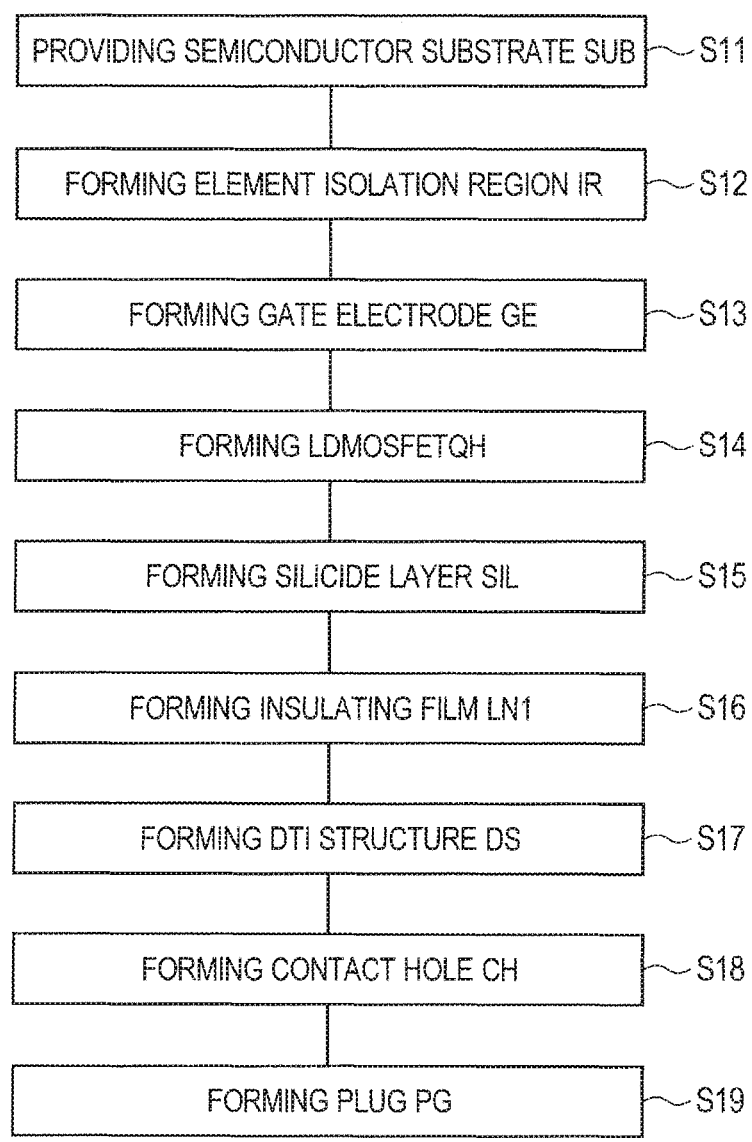
FIG. 5 is a manufacturing process flow chart showing some of manufacturing steps of the semiconductor device of First Embodiment.
Figure 6:
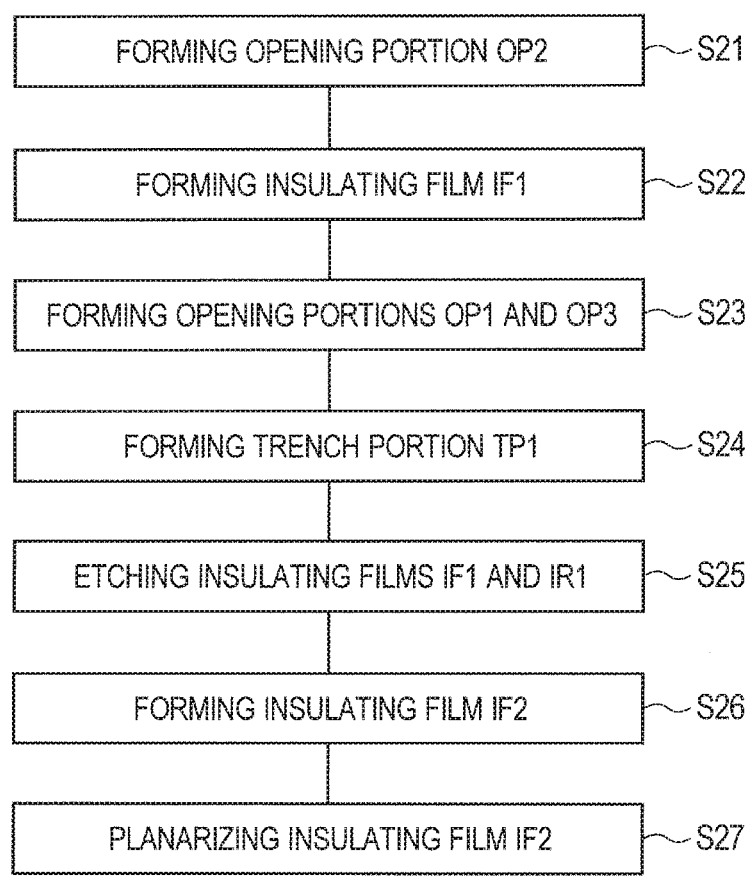
FIG. 6 is a manufacturing process flow chart showing some of manufacturing steps of the semiconductor device of First Embodiment.

Next, a method of manufacturing a semiconductor device of the present embodiment will be described. FIGS. 5 and 6 are manufacturing process flow charts showing some manufacturing steps of the semiconductor device of First Embodiment. FIG. 6 shows manufacturing steps included in Step S17 of FIG. 5. FIGS. 7 to 31 are fragmentary cross-sectional views of the semiconductor device of First Embodiment during manufacturing steps thereof. Of these, FIGS. 12, 14, 22, 27, and 30 are enlarged cross-sectional views showing an enlarged configuration near the DTI structure, FIGS. 16 to 21, FIGS. 23 to 26, and FIG. 28 are enlarged cross-sectional views showing a further enlarged configuration near the DTI structure.

Figure 29:
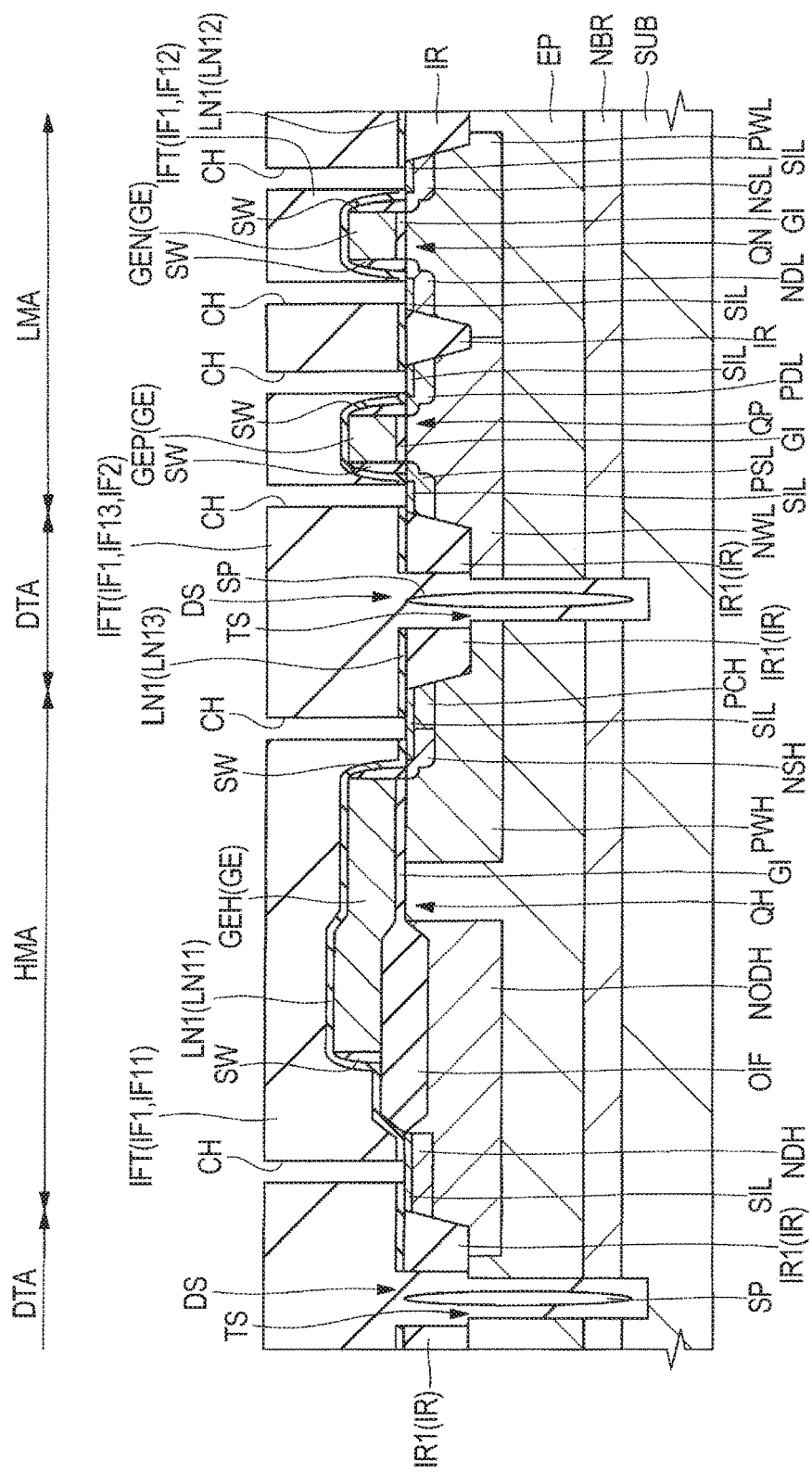
FIG. 29 is a fragmentary cross-sectional view of the semiconductor device of First Embodiment during a manufacturing step thereof.

In FIGS. 12, 14, 22, 27, and 30, an example of the DTI structure DS formed near one n channel MISFETQN is shown to facilitate understanding. As shown in FIGS. 15, 29, and 31, the DTI structure DS may be formed between a LDMOSFETQH and a p channel MISFETQP or it may be formed around various other elements.

Figure 7:
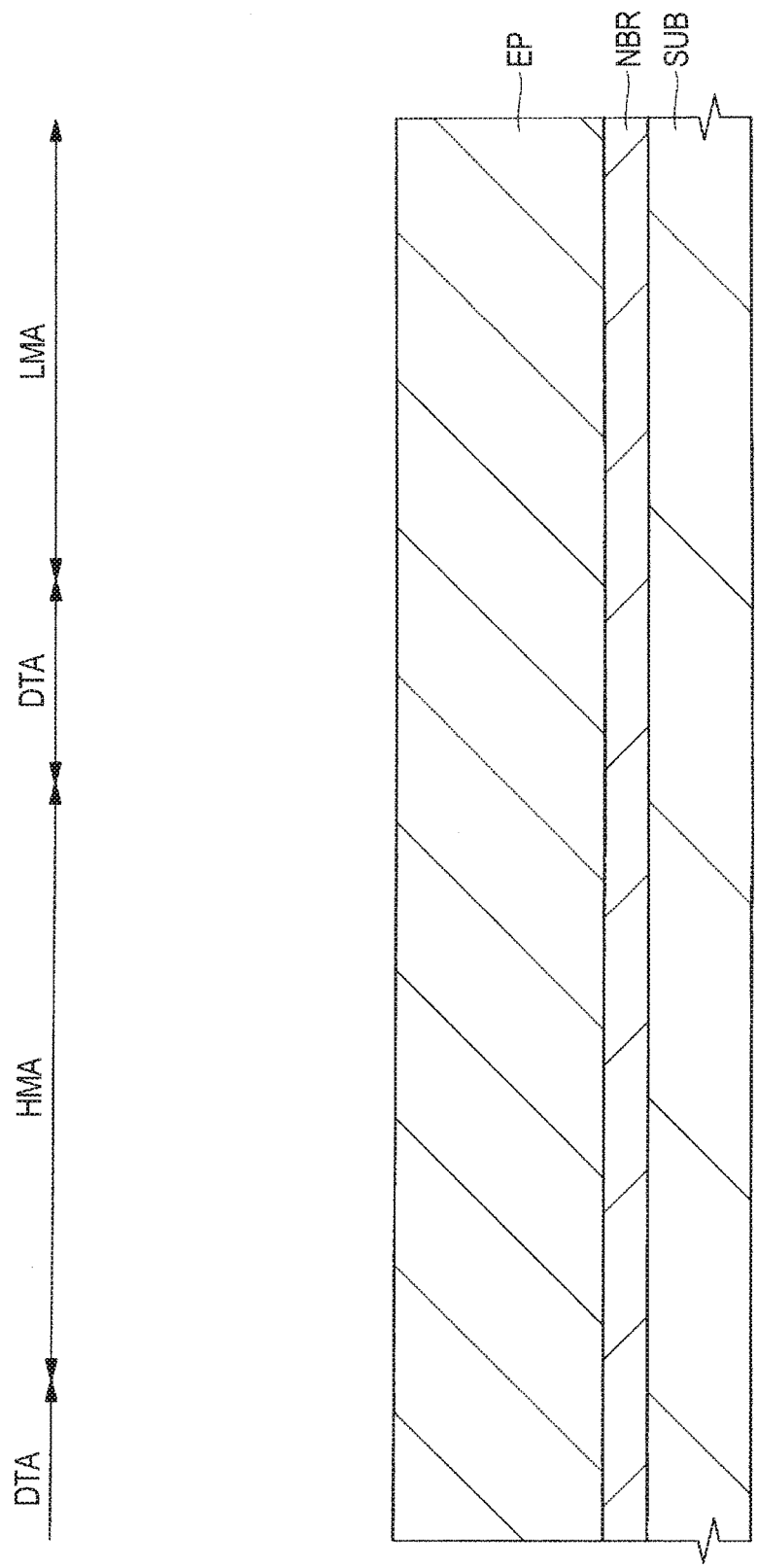
FIG. 7 is a fragmentary cross-sectional view of the semiconductor device of First Embodiment during a manufacturing step thereof.

First, as shown in FIG. 7, a semiconductor substrate SUB is provided (Step S11 in FIG. 5). The semiconductor substrate SUB provided in this step S11 is a low resistance substrate made of, for example, p type single crystal silicon (Si) and having a resistivity (specific resistance) of, for example, from about 1 to 10 mΩ·cm. The semiconductor substrate SUB has a high breakdown voltage MOS region HMA, a low breakdown voltage MOS region LMA, and a DTI region DTA as a region on the side of the surface, as the main surface, of the semiconductor substrate SUB. The semiconductor substrate SUB has, on the side of the surface as the main surface thereof, an n type buried region NBR. Then, a p⁻ type epitaxial layer EP made of, for example, p type single crystal Si is formed on the surface of the semiconductor substrate SUB by a known epitaxial growth method.

Figure 8:
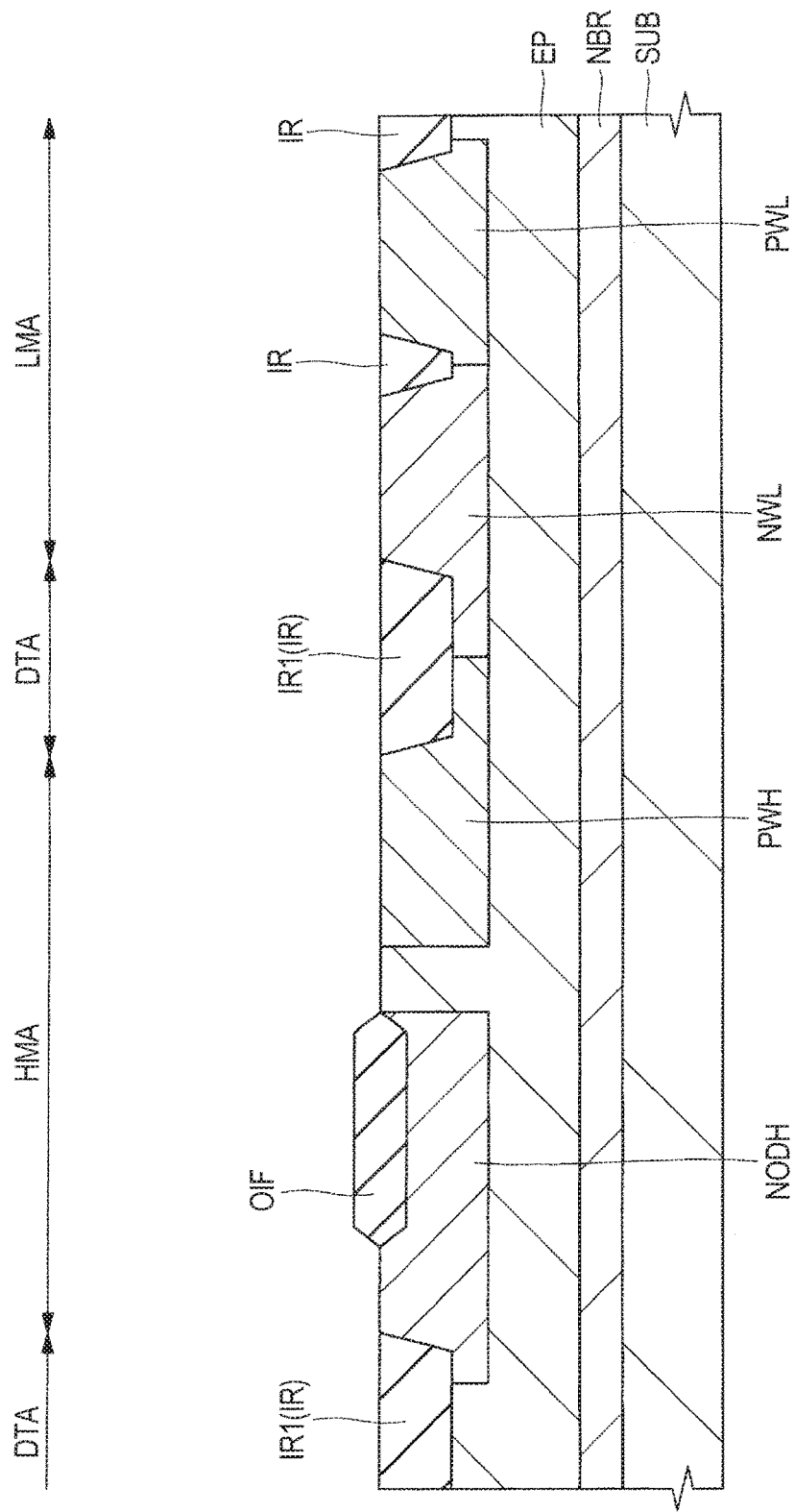
FIG. 8 is a fragmentary cross-sectional view of the semiconductor device of First Embodiment during a manufacturing step thereof.

Next, as shown in FIG. 8, an element isolation region IR is formed (Step S12 in FIG. 5). In this Step S12, an insulating film as the element isolation region IR is formed on the surface, as the main surface, of the semiconductor substrate SUB, that is, on the surface of the p⁻ type epitaxial layer EP, for example, by STI (shallow trench isolation) or LOCOS (local oxidization of silicon). Here, formation of an insulating film as the element isolation region IR by STI will be described.

First, by dry etching with an unillustrated photoresist pattern as an etching mask, the p⁻ type epitaxial layer EP in a region where the element isolation region IR is to be formed is removed to form an element isolation trench.

Next, an insulating film made of silicon oxide is deposited on the surface of the p⁻ type epitaxial layer EP by CVD or the like to fill the element isolation trench with the insulating film. In other words, an insulating film made of a silicon oxide film is formed on the surface of the semiconductor substrate SUB. As the silicon oxide film, a silicon oxide film formed by CVD using a gas containing, for example, an ozone (O₃) gas and tetraethoxysilane (TEOS) can be used.

Next, the insulating film is polished by CMP (chemical mechanical polishing) or the like to planarize the surface of the insulating film. As a result, an insulating film as the element isolation region IR buried in the element isolation trench is formed.

As described above, the insulating film as the element isolation region IR formed on the surface of the semiconductor substrate SUB in the DTI region DTA is called "insulating film IR1".

In Step S12, in the high breakdown voltage MOS region HMA, an offset insulating film OIF made of a silicon oxide film is formed, separately from the element isolation region IR, on the surface of the p⁻ type epitaxial layer EP, for example, by LOCOS in which thermal oxidation is performed using a mask. Instead of LOCOS, STI may be used for the formation of the offset insulating film OIF.

Next, with an unillustrated photoresist pattern as a mask, a p type impurity such as boron (B) is introduced into a portion of the p⁻ type epitaxial layer EP by ion implantation to form a p type well region PWH in the high breakdown voltage MOS region HMA and a p type well region PWL in the low breakdown voltage MOS region LMA. After ion implantation, the impurity thus introduced may be activated by annealing, that is, heat treatment.

With an unillustrated photoresist pattern as a mask, an n type impurity such as phosphorus (P) or arsenic (As) is introduced into a portion of the p⁻ type epitaxial layer EP by ion implantation to form an n type offset drain region NODH in the high breakdown voltage MOS region HMA and an n type well region NWL in the low breakdown voltage MOS region LMA. At this time, the n type offset drain region NODH is formed at a position separated from the p type well region PWH in plan view. After ion implantation, the impurity thus introduced may be activated by annealing, that is, heat treatment.

Figure 9:
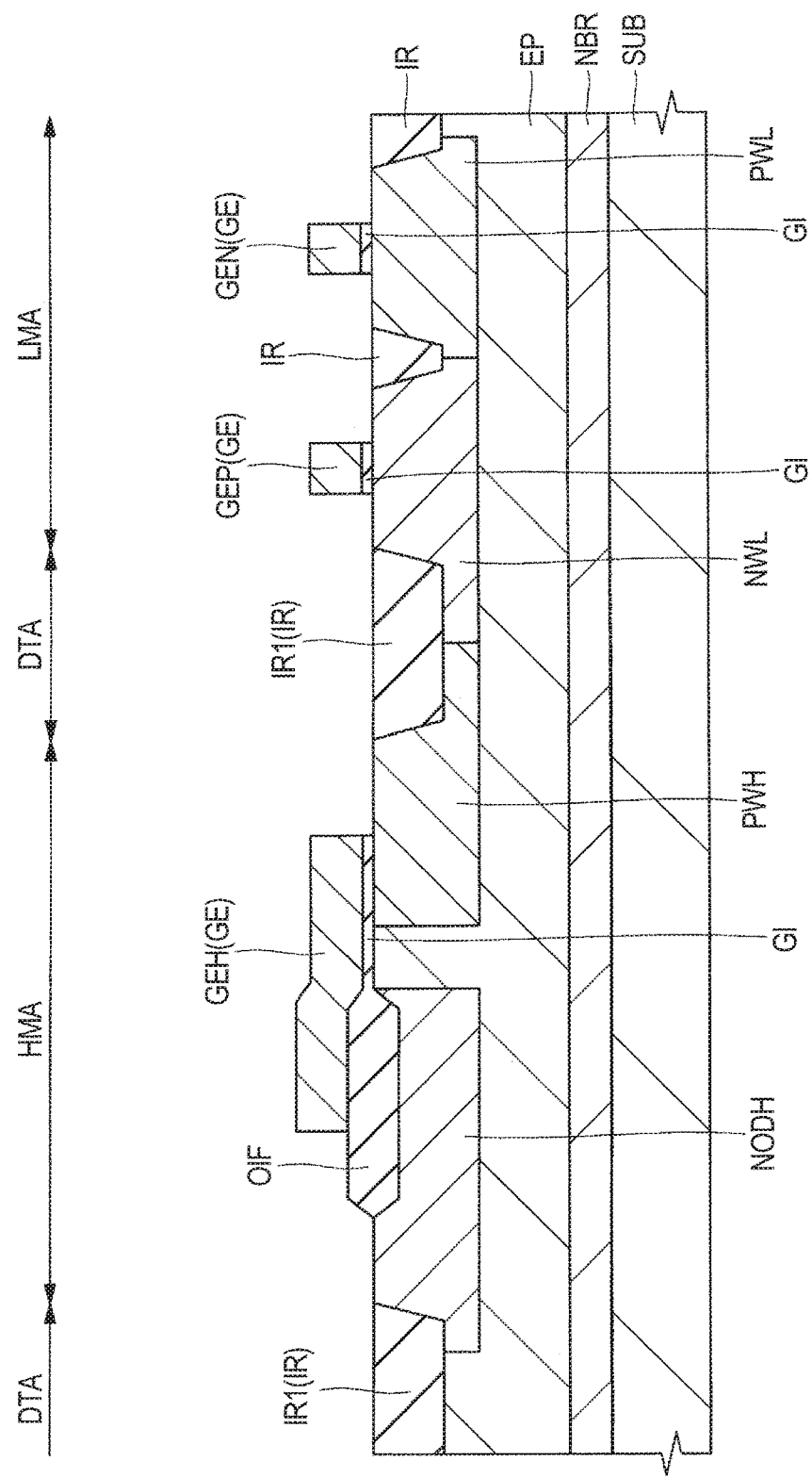
FIG. 9 is a fragmentary cross-sectional view of the semiconductor device of First Embodiment during a manufacturing step thereof.

Next, as shown in FIG. 9, a gate electrode GE is formed (Step S13 in FIG. 5). In this step S13, the semiconductor substrate SUB is subjected to, for example, thermal oxidation to form a gate insulating film GI made of a silicon oxide film or the like on the surface of the p⁻ type epitaxial layer EP. As the gate insulating film GI, a nitrogen-containing silicon oxide film, so-called oxynitride film may be used instead of the thermal oxide film.

Next, a conductor film made of, for example, a polycrystalline silicon film having an n type impurity introduced therein is formed on the gate insulating film GI by CVD or the like.

Next, the conductor film and the gate insulating film GI are patterned by photolithography and dry etching. By this patterning, a gate electrode GEH which is a gate electrode GE of the LDMOSFETQH (refer to FIG. 10) in the high breakdown voltage MOS region HMA is formed; a gate electrode GEP which is a gate electrode GE of the p channel MISFETQP (refer to FIG. 10) in the low breakdown voltage MOS region LMA is formed; and a gate electrode GEN which is a gate electrode GE in the n channel MISFETQN (refer to FIG. 10) in the low breakdown voltage MOS region LMA is formed.

In the high breakdown voltage MOS region HMA, the gate electrode GEH starts from above the p type well region PWH, goes over the p⁻ type epitaxial layer EP, and extends on the offset insulating film OIF on the n type offset drain region NODH. This means that a portion of the gate electrode GEH on the source side is formed over the p type well region PWH and the p⁻ type epitaxial layer EP via the gate insulating film GI. A portion of the gate electrode GEH on the drain side is formed over the n type offset drain region NODH via the offset insulating film OIF.

On the other hand, in the low breakdown voltage MOS region LMA, the gate electrode GEP is formed over the n type well region NWL via the gate insulating film GI and the gate electrode GEN is formed over the p type well region PWL via the gate insulating film GI.

Figure 10:
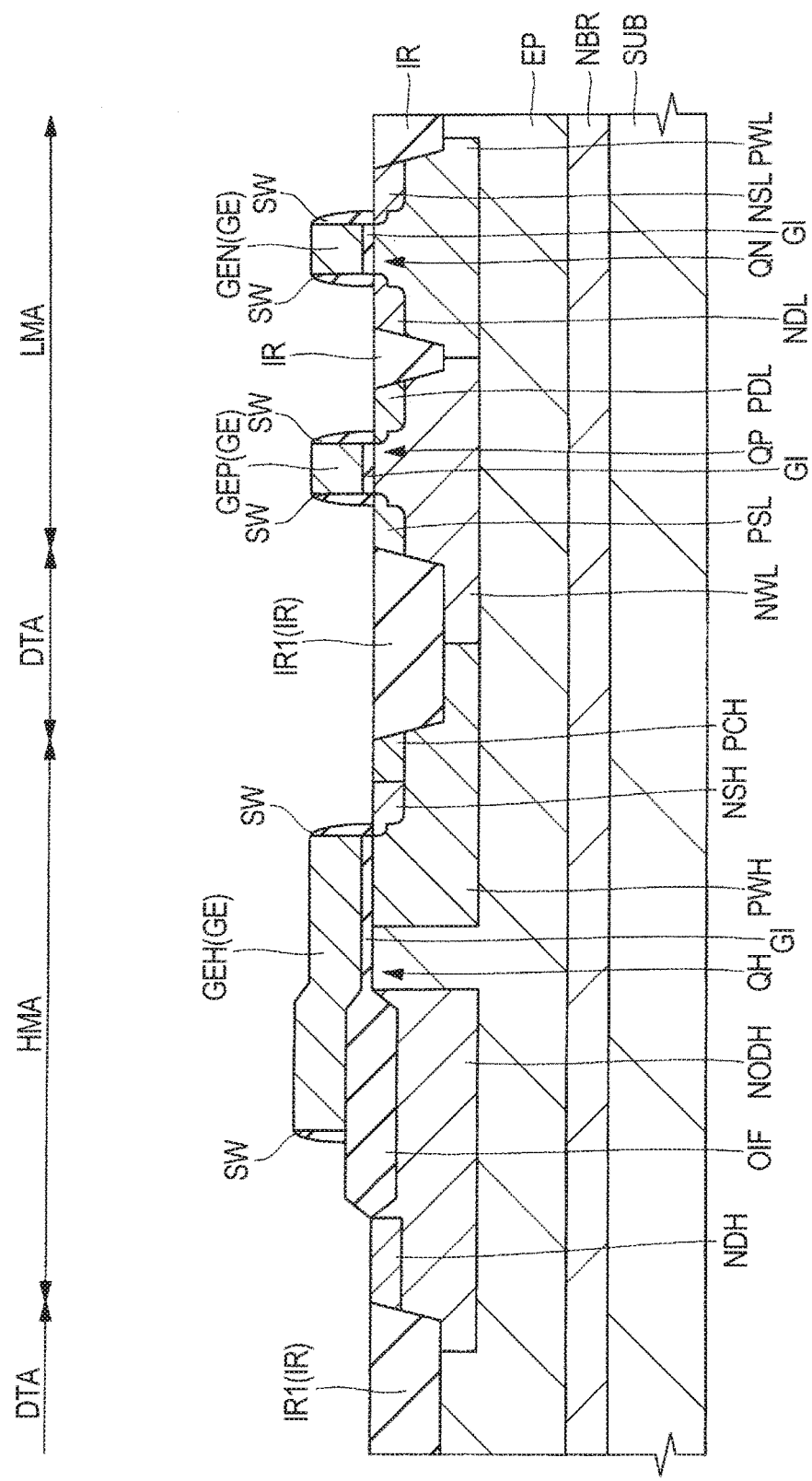
FIG. 10 is a fragmentary cross-sectional view of the semiconductor device of First Embodiment during a manufacturing step thereof.

Next, as shown in FIG. 10, a LDMOSFETQH is formed (Step S14 in FIG. 5). In this step S14, a p type impurity such as boron (B) is introduced into a portion of the surface of the semiconductor substrate SUB by ion implantation and an n type impurity such as phosphorus (P) or arsenic (As) is introduced into another portion of the surface of the semiconductor substrate SUB by ion implantation.

A sidewall spacer SW made of an insulating film such as silicon oxide film is formed on the sidewalls of each of the gate electrodes GEH, GEP, and GEN. The sidewall spacer SW is formed, for example, by depositing an insulating film such as silicon oxide film on the semiconductor substrate SUB by CVD or the like and then anisotropically etching the insulating film thus deposited.

Moreover, after formation of the sidewall spacer SW, a p type impurity such as boron (B) is introduced into a portion of the surface of the semiconductor substrate SUB by ion implantation and an n type impurity such as phosphorus (P) or arsenic (As) is introduced into another portion of the surface of the semiconductor substrate SUB by ion implantation.

As a result, in the high breakdown voltage MOS region HMA, an n⁻ type source region NSH is formed in the upper layer portion of the p type well region PWH. The n⁻ type source region NSH is formed so that an end portion of the n⁻ type source region NSH is in alignment with the gate electrode GEH. A p⁺ type contact region PCH is formed in the upper layer portion of the p type well region PWH and on the side opposite to the gate electrode GEH with the n⁻ type source region NSH therebetween.

In the high breakdown voltage MOS region HMA, an n⁺ type drain region NDH is formed in the upper layer portion of the n type offset drain region NODH. The n⁺ type drain region NDH is formed in the upper layer portion of the n type offset drain region NODH sandwiched between the element isolation region IR and the offset insulating film OIF.

By the above-mentioned steps, the LDMOSFETQH having the $p^-$ type epitaxial layer EP, the p type well region PWH, the $n^+$ type source region NSH, the n type offset drain region NODH, the $n^+$ type drain region NDH, the gate insulating film GI, and the gate electrode GEH is formed in the high breakdown voltage MOS region HMA. By providing a heavily-doped drain region on the drain side via the lightly doped offset drain region, the LDMOSFET is capable of securing a high drain breakdown voltage. The n type impurity concentration in the $n^+$ type drain region NDH is therefore made higher than the n type impurity concentration in the n type offset drain region NODH.

In the low breakdown voltage MOS region LMA, on the other hand, a $p^+$ type source region PSL and a $p^+$ type drain region PDL are formed in the upper layer portion of the n type well region NWL. The $p^+$ type source region PSL and the $p^+$ type drain region PDL are formed in alignment with the gate electrode GEP, respectively, in two portions in the upper layer portion of the n type well region NWL opposite to each other with the gate electrode GEP therebetween.

By the above-mentioned steps, a p channel MISFETQP having the n type well region NWL, the $p^+$ type source region PSL, the $p^+$ type drain region PDL, the gate insulating film GI, and the gate electrode GEP is formed in the low breakdown voltage MOS region LMA.

In addition, in the low breakdown voltage MOS region LMA, an $n^+$ type source region NSL and an $n^+$ type drain region NDL are formed in the upper layer portion of the p type well region PWL. The $n^+$ type source region NSL and the $n^+$ type drain region NDL are formed in alignment with the gate electrode GEN, respectively, in two portions in the upper layer portion of the p type well region PWL opposite to each other with the gate electrode GEN therebetween.

By the above-mentioned steps, an n channel MISFETQN having the p type well region PWL, the $n^+$ type source region NSL, the $n^+$ type drain region NDL, the gate insulating film GI, and the gate electrode GEN are formed in the low breakdown voltage MOS region LMA.

The $n^+$ type source region NSH, the $n^+$ type source region NSL, and the $n^+$ type drain region NDL can each be formed as a source/drain region having an LDD (lightly doped drain) structure comprised of an $n^-$ type semiconductor region and an $n^+$ type semiconductor region having an n type impurity concentration higher than that of the $n^-$ type semiconductor region. The $p^+$ type source region PSL and the $p^+$ type drain region PDL can each be formed as a source/drain region having an LDD structure comprised of a $p^-$ type semiconductor region and a $p^+$ type semiconductor region having a $p^-$ type impurity concentration higher than that of the $p^-$ type semiconductor region.

Figure 11:
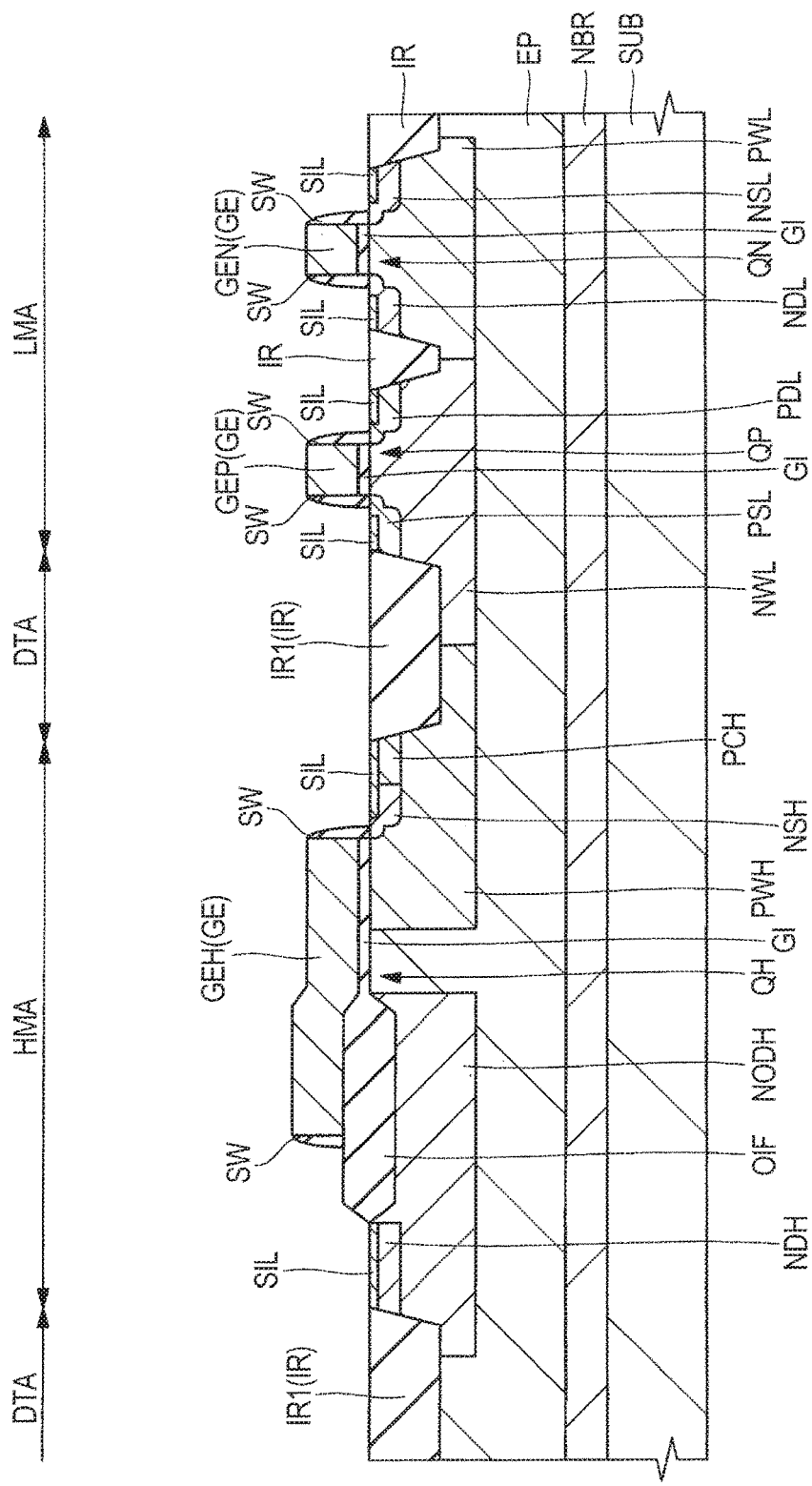
FIG. 11 is a fragmentary cross-sectional view of the semiconductor device of First Embodiment during a manufacturing step thereof.
Figure 12:
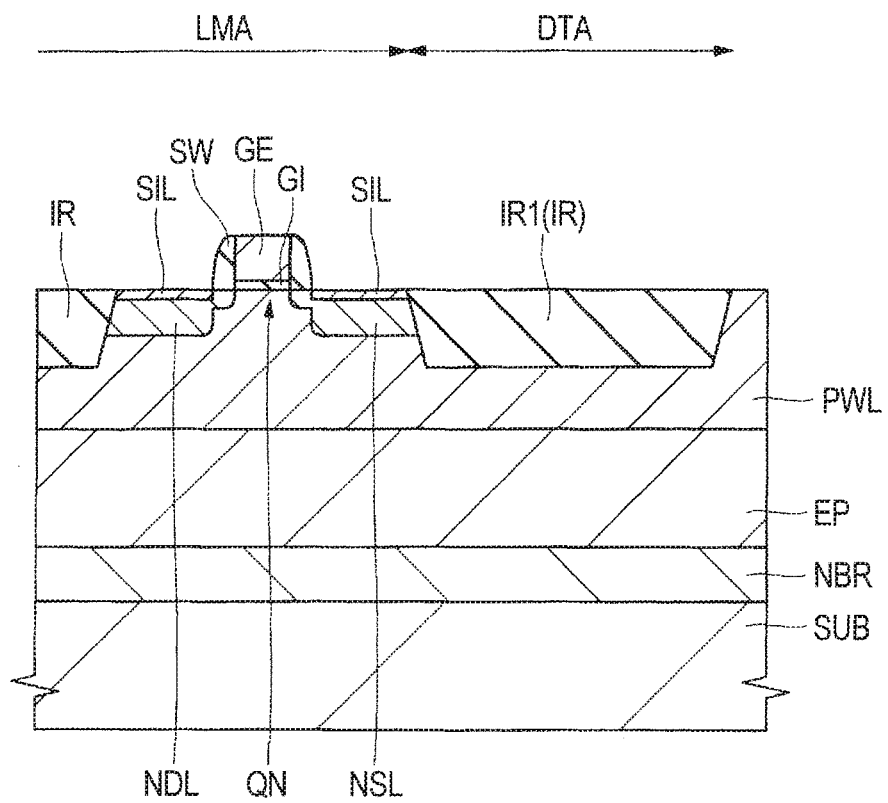
FIG. 12 is a fragmentary cross-sectional view of the semiconductor device of First Embodiment during a manufacturing step thereof.

Next, as shown in FIGS. 11 and 12, a silicide layer SIL is formed (Step S15 in FIG. 5). In Step S15, a silicide layer SIL is formed on the surface of each of the $n^+$ type source region NSH, the $n^+$ type drain region NDH, and the $p^+$ type contact region PCH in the high breakdown voltage MOS region HMA. Further, a silicide layer SIL is formed on the surface of each of the $p^+$ type source region PSL, the $p^+$ type drain region PDL, the $n^+$ type source region NSL, and the $n^+$ type drain region NDL in the low breakdown voltage MOS region LMA. The silicide layer SIL is made of, for example, a metal silicide film such as cobalt silicide film. The silicide layer SIL can be formed, for example, by the salicide (self aligned silicide) process.

This makes it possible to reduce the contact resistance between each of the $n^+$ type source region NSH, the $n^+$ type drain region NDH, the $p^+$ type contact region PCH, the $p^+$ type source region PSL, the $p^+$ type drain region PDL, the $n^+$ type source region NSL, and the $n^+$ type drain region NDL and a plug PG (refer to FIG. 31).

Figure 13:
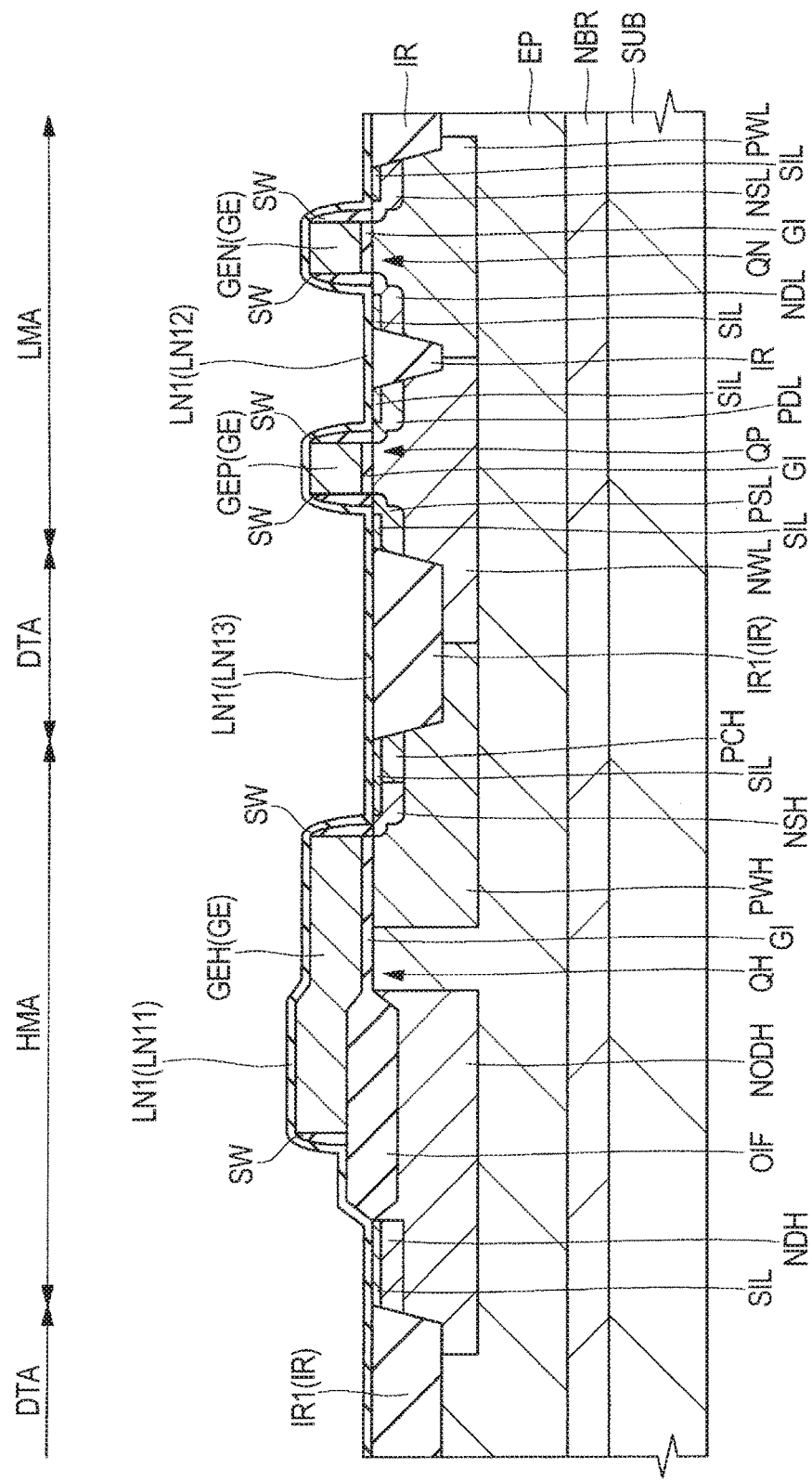
FIG. 13 is a fragmentary cross-sectional view of the semiconductor device of First Embodiment during a manufacturing step thereof.
Figure 14:
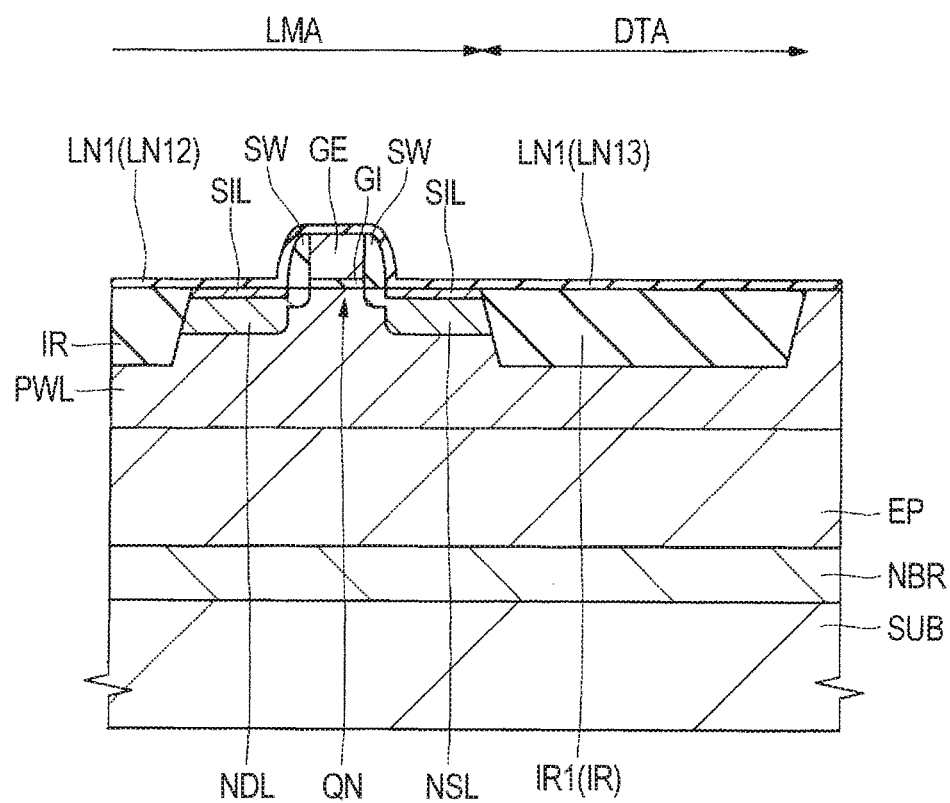
FIG. 14 is a fragmentary cross-sectional view of the semiconductor device of First Embodiment during a manufacturing step thereof.
Figure 15:
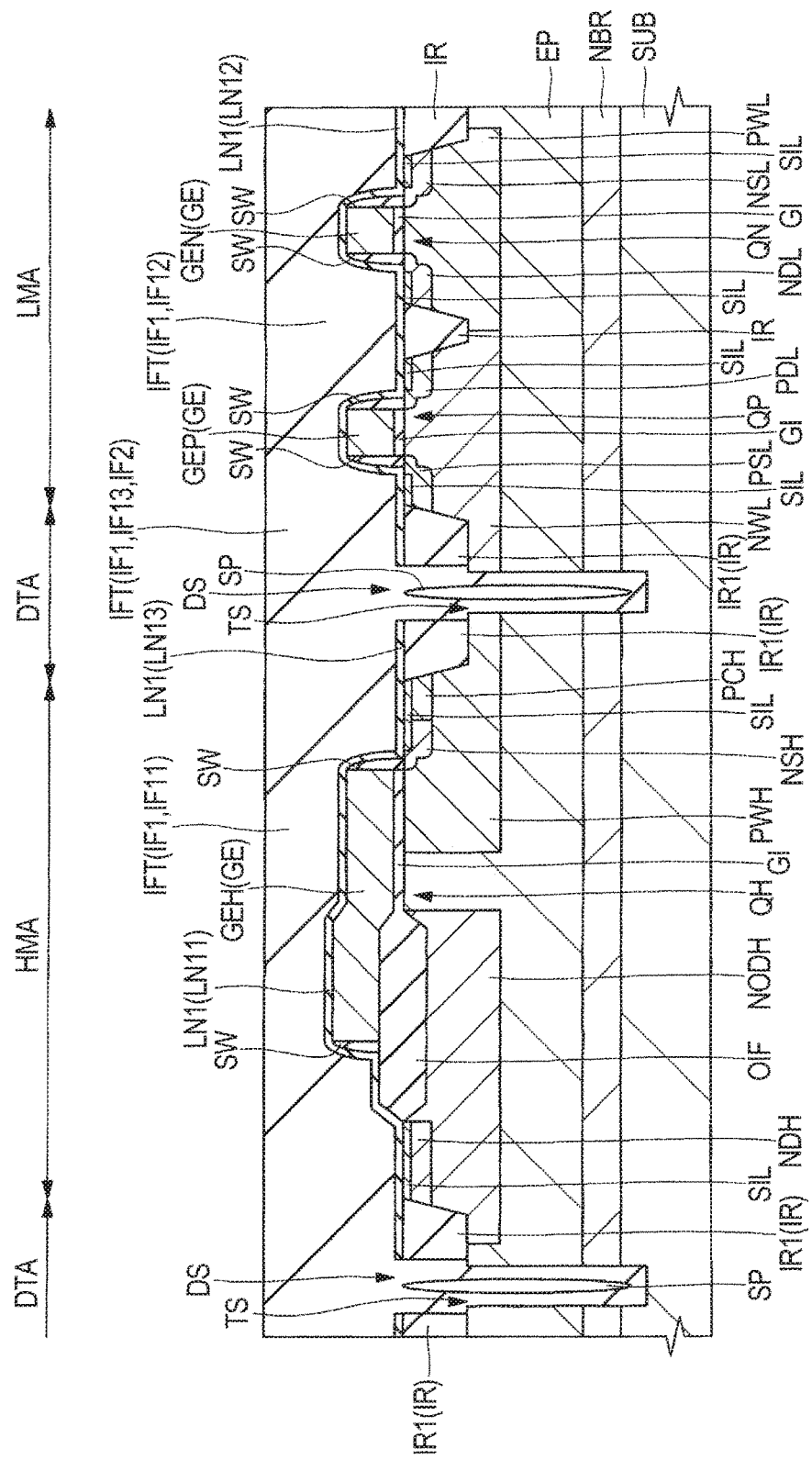
FIG. 15 is a fragmentary cross-sectional view of the semiconductor device of First Embodiment during a manufacturing step thereof.

Next, as shown in FIGS. 13 and 14, an insulating film LN1 is formed (Step S16 in FIG. 5). In this Step S16, an insulating film LN1 is formed, for example, by CVD so as to cover the LDMOSFETQH, the p channel MISFETQP, and the n channel MISFETQN. In the DTI region DTA, the insulating film LN1 is formed also on the insulating film IR1 as the element isolation region IR.

In the high breakdown voltage MOS region HMA, the insulating film LN1 formed to cover therewith the LDMOSFETQH will hereinafter be called "insulating film LN11". In the low breakdown voltage MOS region LMA, the insulating film LN1 formed to cover therewith the p channel MISFETQP and the n channel MISFETQN will hereinafter be called "insulating film LN12". Further in the DTI region DTA, the insulating film LN1 formed on the insulating film IR1 as the element isolation region IR will hereinafter be called "insulating film LN13". At this time, the insulating films LN11, LN12, and LN13 are all formed as the same layer.

The etch rate of the insulating film LN1 by an etching agent to be used for etching of the insulating film IR1 as the element isolation region IR is smaller than the etch rate of the insulating film IR1 by this etching agent. The insulating film IR1 can therefore be etched selectively without etching the insulating film LN1.

Next, as shown in FIG. 15, a DTI structure DS is formed (Step S17 in FIG. 5). In this step S17, a trench structure TS is formed in the surface of the semiconductor substrate SUB and then, an insulating film IFT is formed so as to close the trench structure TS therewith. Step S17 includes Steps S21 to S27 in FIG. 6. The steps from Step S21 to S27 in FIG. 6 will next be described referring to FIGS. 16 to 28.

Figure 16:
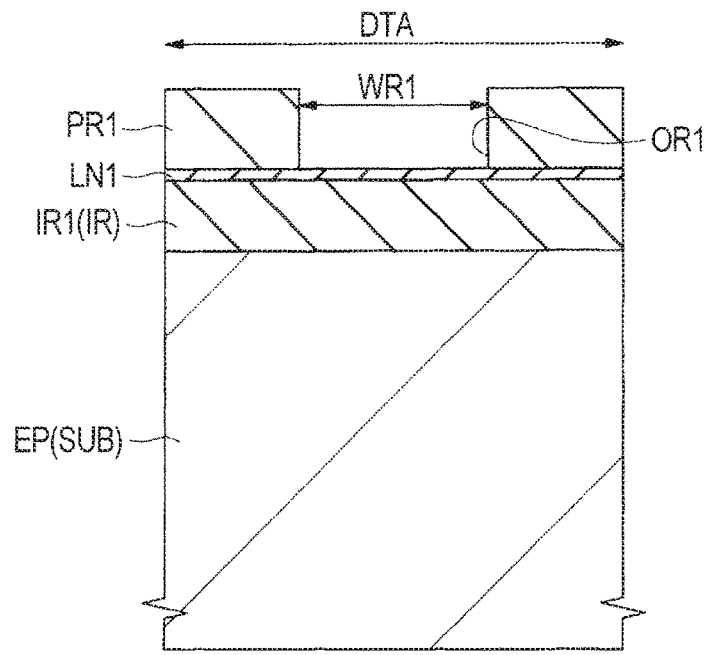
FIG. 16 is a fragmentary cross-sectional view of the semiconductor device of First Embodiment during a manufacturing step thereof.
Figure 17:
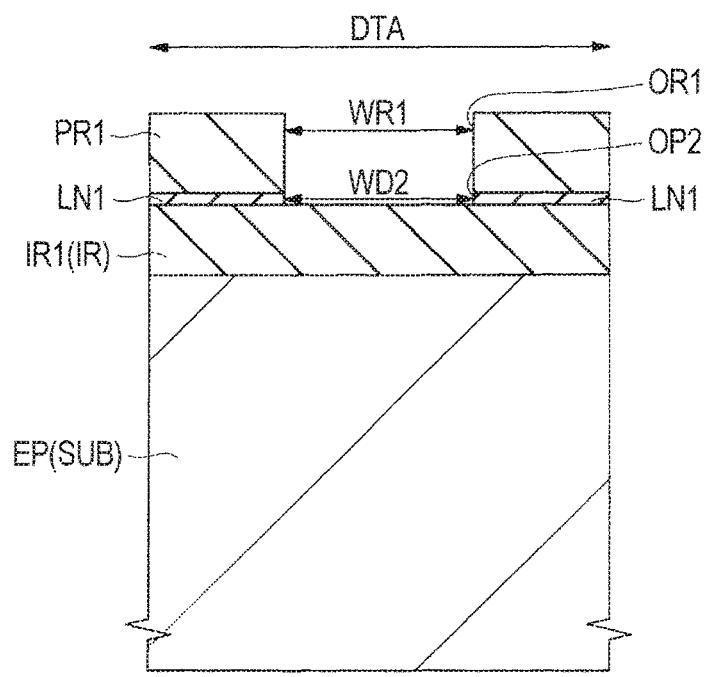
FIG. 17 is a fragmentary cross-sectional view of the semiconductor device of First Embodiment during a manufacturing step thereof.

First, as shown in FIGS. 16 and 17, an opening portion OP2 is formed (Step S21 in FIG. 6). In this Step S21, an opening portion OP2 penetrating through the insulating film LN1 and reaching the upper surface of the insulating film IR1 is formed in the DTI region DTA in which the DTI structure DS is to be formed.

First, a resist film PR1 made of a photoresist is formed on the insulating film LN1. The resist film PR1 thus formed is subjected to pattern exposure and then developed. As a result, as shown in FIG. 16, an opening portion OR1 penetrating through the resist film PR1 and reaching the upper surface of the insulating film LN1 is formed.

The opening width WR1 of the opening portion OR1 is determined depending on the opening width WD2 of the opening portion OP2. For example, the opening width WR1 of the opening portion OR1 is equal to the opening width WD2 of the opening portion OP2. At this time, the opening portion OR1 is formed so that the opening width WR1 of the opening portion OR1 becomes greater than the opening width WD1 of an opening portion OP1 (refer to FIG. 20) to be formed in Step S23 in FIG. 6 which will be described later. A difference between the opening width WR1 of the opening portion OR1 and the opening width WD1 of the opening portion OP1 can be set at, for example, from 200 to 500 nm.

For example, the opening portion OR1 can be formed by performing overexposure by using a photomask for forming the opening portion OP1 and thereby adjusting an exposure amount for pattern exposure of the resist film PR1 to be greater than a typical exposure amount, that is, an exposure amount for pattern exposure of a resist film PR2 (refer to FIG. 19) described later by using the photomask. Alternatively, the opening portion OR1 can be formed by using a photomask for forming the opening portion OP2 and adjusting an exposure amount for pattern exposure of the resist film PR1 to be equal to the typical exposure amount.

Next, with the resist film PR1 having therein the opening portion OR1 as an etching mask, a portion of the insulating film LN1 exposed from the bottom surface of the opening portion OR1 is etched. As a result, as shown in FIG. 17, an opening portion OP2 penetrating through the insulating film LN1 and reaching the upper surface of the insulating film IR1 is formed. At this time, the opening portion OP2 is formed so as to make the opening width WD2 of the opening portion OP2 greater than the opening width WD1 of an opening portion OP1 (refer to FIG. 20) which will be formed in a later step.

Figure 18:
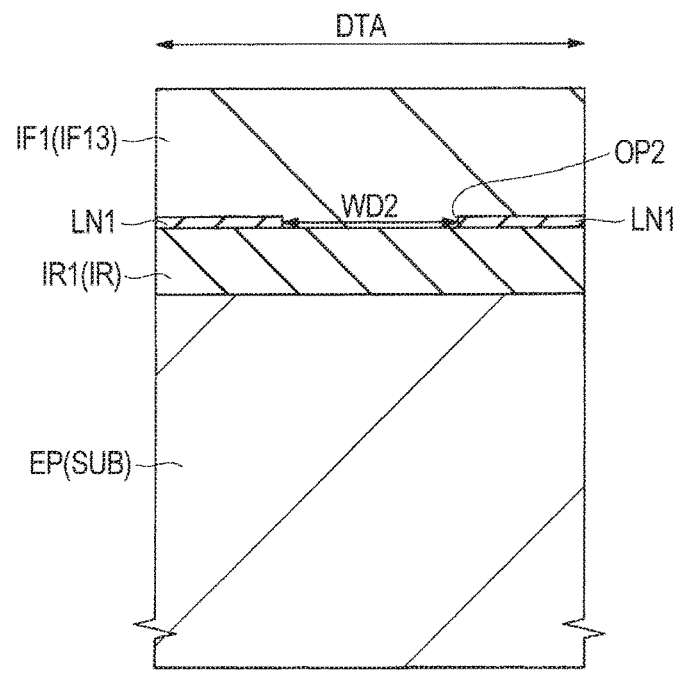
FIG. 18 is a fragmentary cross-sectional view of the semiconductor device of First Embodiment during a manufacturing step thereof.

As shown in FIG. 18, an insulating film IF1 is formed (Step S22 in FIG. 6). In Step S22, in the DTI region DTA, the insulating film IF1 is formed on a portion of the insulating film IR1 exposed from the bottom surface of the opening portion OP2 and on the insulating film LN1 so as to fill the opening portion OP2. The insulating film IF1 contains silicon and oxygen.

Although not illustrated, in the high breakdown voltage MOS region HMA, the insulating film IF1 is formed so as to cover the LDMOSFETQH via the insulating film LN1. In the low breakdown voltage MOS region LMA, the insulating film IF1 is formed so as to cover the p channel MISFETQP and the n channel MISFETQN via the insulating film LN1.

The insulating film IF1 formed so as to cover the LDMOSFETQH in the high breakdown voltage MOS region HMA will hereinafter be called "insulating film IF11" (refer to FIG. 15). The insulating film IF1 formed so as to cover the p channel MISFETQP and the n channel MISFETQN via the insulating film LN1 in the low breakdown voltage MOS region LMA will hereinafter be called "insulating film IF12" (refer to FIG. 15). The insulating film IF1 formed on a portion of the insulating film IR1 exposed from the bottom surface of the opening portion OP2 and on the insulating film LN1 in the DTI region DTA will hereinafter be called "insulating film IF13". At this time, the insulating films IF11, IF12, and IF13 are all formed as the same layer.

The insulating film IF1, similar to the insulating film IR1, contains silicon and oxygen. Therefore, an etching agent of the same kind as that to be used for etching of the insulating film IR1 can be used as an etching agent for etching of the insulating film IF1.

At this time, the etch rate of the insulating film LN1 by an etching agent to be used for etching of the insulating film IR1 is smaller than the etch rate of the insulating film IF1 by this etching agent. The insulating film IF1 can be etched selectively by an etching agent of the same kind as that for etching of the insulating film IR1 without etching the insulating film LN1.

When the insulating films IR1 and IF1 each contain silicon and oxygen, the insulating film LN1 preferably contains silicon and nitrogen. When the insulating films IR1 and IF1 are each made of a silicon oxide film, the insulating film LN1 is preferably made of a silicon nitride film or a silicon oxynitride film. The etch rate of the insulating film LN1 by an etching agent to be used for etching of the insulating films IR1 and IF1 can be made smaller than the etch rate of each of the insulating films IR1 and IF1 by this etching agent.

When the insulating films IR1 and IF1 each contain silicon and oxygen, a hydrofluoric acid-containing etchant may be used as an etching agent to be used for etching of the insulating films IR1 and IF1. The etch rate of the insulating film LN1 by the hydrofluoric acid-containing etchant is considerably smaller than the etch rate of each of the insulating films IR1 and IF1 by the etchant. This facilitates selective etching of the insulating films IR1 and IF1 without etching the insulating film LN1.

Figure 19:
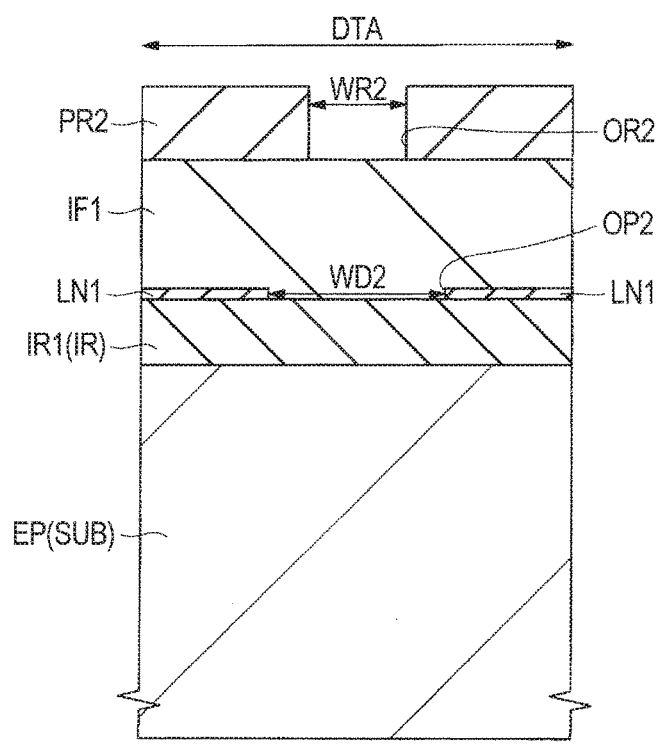
FIG. 19 is a fragmentary cross-sectional view of the semiconductor device of First Embodiment during a manufacturing step thereof.
Figure 20:
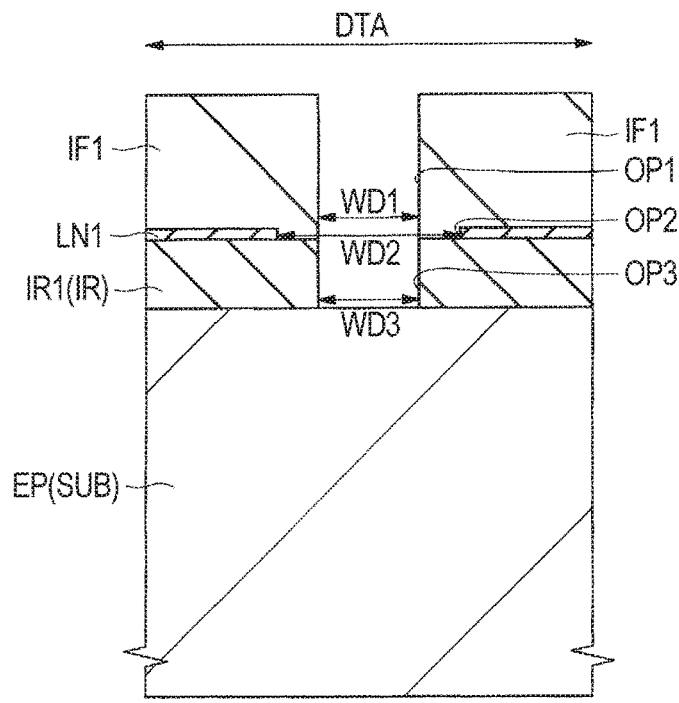
FIG. 20 is a fragmentary cross-sectional view of the semiconductor device of First Embodiment during a manufacturing step thereof.

Next, as shown in FIGS. 19 and 20, opening portions OP1 and OP3 are formed (Step S23 in FIG. 6). In this Step S23, in the DTI region DTA, an opening portion OP1 penetrating through the insulating film IF1 and reaching the upper surface of the insulating film IR1 is formed in a region having therein the opening portion OP2 in plan view. In addition, an opening portion OP3 penetrating through a portion of the insulating film IR1 exposed from the bottom surface of the opening portion OP1 and reaching the upper surface of the semiconductor substrate SUB is formed. The opening portion OP3 is therefore formed in a region having therein the opening portion OP2 in plan view.

First, a resist film PR2 made of a photoresist is formed on the insulating film IF1. The resist film PR2 thus formed is subjected to pattern exposure, followed by development. As a result, an opening portion OR2 penetrating through the resist film PR2 and reaching the upper surface of the insulating film IF1 is formed as shown in FIG. 19.

The opening width WR2 of the opening portion OR2 is determined depending on the opening width WD1 of the opening portion OP1 and the opening width WD3 of the opening portion OP3. For example, the opening width WR2 of the opening portion OR2 is equal to the opening width WD1 of the opening portion OP1 and the opening width WD3 of the opening portion OP3 formed in Step S23. At this time, the opening portion OR2 is formed so that the opening width WR2 of the opening portion OR2 becomes smaller than the opening width WD2 of the opening portion OP2. A difference between the opening width WR2 of the opening portion OR2 and the opening width WD2 of the opening portion OP2 can be set at, for example, from 200 to 500 nm.

For example, the opening portion OR2 can be formed by using a photomask for forming the opening portion OP1 and making an exposure amount for pattern exposure of the resist film PR2 equal to a typical exposure amount. Alternatively, the opening portion OR2 can be formed by performing under exposure by using a photomask for forming the opening portion OP2 and thereby adjusting an exposure amount for pattern exposure of the resist film PR2 to be smaller than a typical exposure amount, that is, an exposure amount for pattern exposure of the resist film PR1 by using the photo mask.

Next, with the resist film PR2 having therein the opening portion OR2 as an etching mask, the insulating films IF1 and IR1 are etched, followed by, for example, asking to remove the resist film PR2 having therein the opening portion OR2. As a result, as shown in FIG. 20, an opening portion OP1 penetrating through the insulating film IF1 and reaching the upper surface of the insulating film IR1 is formed in a region having therein the opening portion OP2 in plan view. In addition, an opening portion OP3 penetrating through a portion of the insulating film IR1 exposed from the bottom surface of the opening portion OP1 and reaching the upper surface of the semiconductor substrate SUB such as $p^-$ type epitaxial layer EP is formed. The upper end of the opening portion OP3 is communicated with the lower end of the opening portion OP1.

As described above, the opening width WR2 of the opening portion OR2 is smaller than the opening width WD2 of the opening portion OP2. The opening width WD1 of the opening portion OP1 and the opening width WD3 of the opening portion OP3 are equal to the opening width WR2 of the opening portion OR2. Accordingly, the opening width WD1 of the opening portion OP1 and the opening width WD3 of the opening portion OP3 are smaller than the opening width WD2 of the opening portion OP2.

In the DTI region DTA, the insulating film IF1 is not necessarily formed and in this case, the opening portion OP3 penetrating through the insulating film IR1 and reaching the upper surface of the semiconductor substrate SUB such as p⁻ type epitaxial layer EP is formed in a region having therein the opening portion OP2 in plan view.

Figure 21:
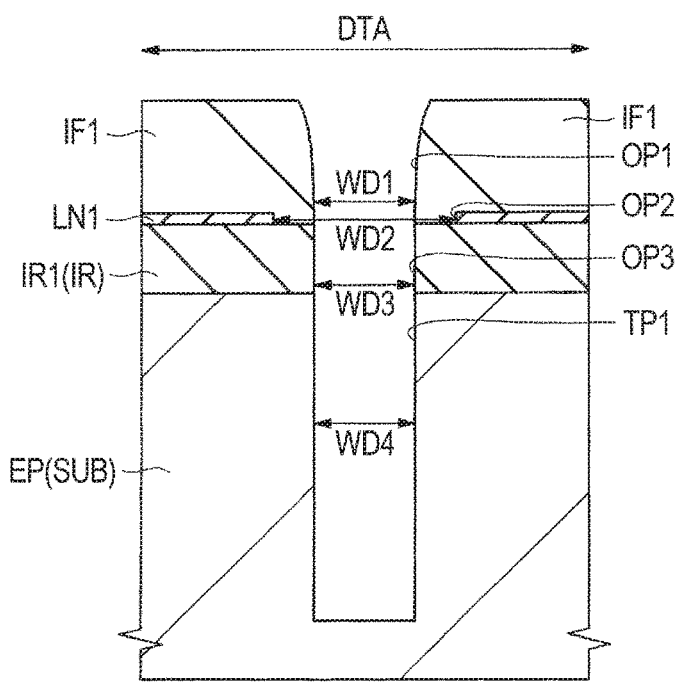
FIG. 21 is a fragmentary cross-sectional view of the semiconductor device of First Embodiment during a manufacturing step thereof.

Next, as shown in FIG. 21, a trench portion TP1 is formed (Step S24 in FIG. 6). In this Step S24, in the DTI region DTA, with the insulating film IF1 having therein the opening portion OP1 and the insulating film IR1 having therein the opening portion OP3 as etching masks, the semiconductor substrate SUB made of, for example, the p⁻ type epitaxial layer EP exposed from the bottom surface of the opening portion OP3 is etched by dry etching or the like. By this etching, a trench portion TP penetrating through the p⁻ type epitaxial layer EP exposed from the bottom surface of the opening portion OP3 and reaching the middle of the semiconductor substrate SUB in the thickness direction thereof is formed in the upper surface of the semiconductor substrate SUB. The upper end of the trench portion TP1 is communicated with the lower end of the opening portion OP3.

When the trench portion TP1 whose aspect ratio, that is, a ratio of the depth to the trench width WD4 is high is formed by dry etching, for example, a step of etching the semiconductor substrate SUB with a gas containing sulfur hexafluoride ($SF_6$) gas and a step of covering the side surface of the trench portion TP1 with a gas containing a carbon fluoride (fluorocarbon) gas such as $C_4F_8$ gas are repeated.

As described above, the opening width WD3 of the opening portion OP3 is smaller than the opening width WD2 of the opening portion OP2. The trench width WD4 of the trench portion TP1 is equal to the opening width WD3 of the opening portion OP3. In Step S24, therefore, the trench portion TP1 is formed so as to make the trench width WD4 of the trench portion TP1 smaller than the opening width WD2 of the opening portion OP2.

The trench portion TP1 can be formed to have a depth of, for example, 15 μm and the trench portion TP1 can be formed to have the trench width WD4 of, for example, 1 μm.

Although not illustrated in FIG. 21, the trench portion TP1 may be formed so as to surround any of the LDMOS-FETQH, the p channel MISFETQH, and the n channel MISFETQN in plan view.

Figure 22:
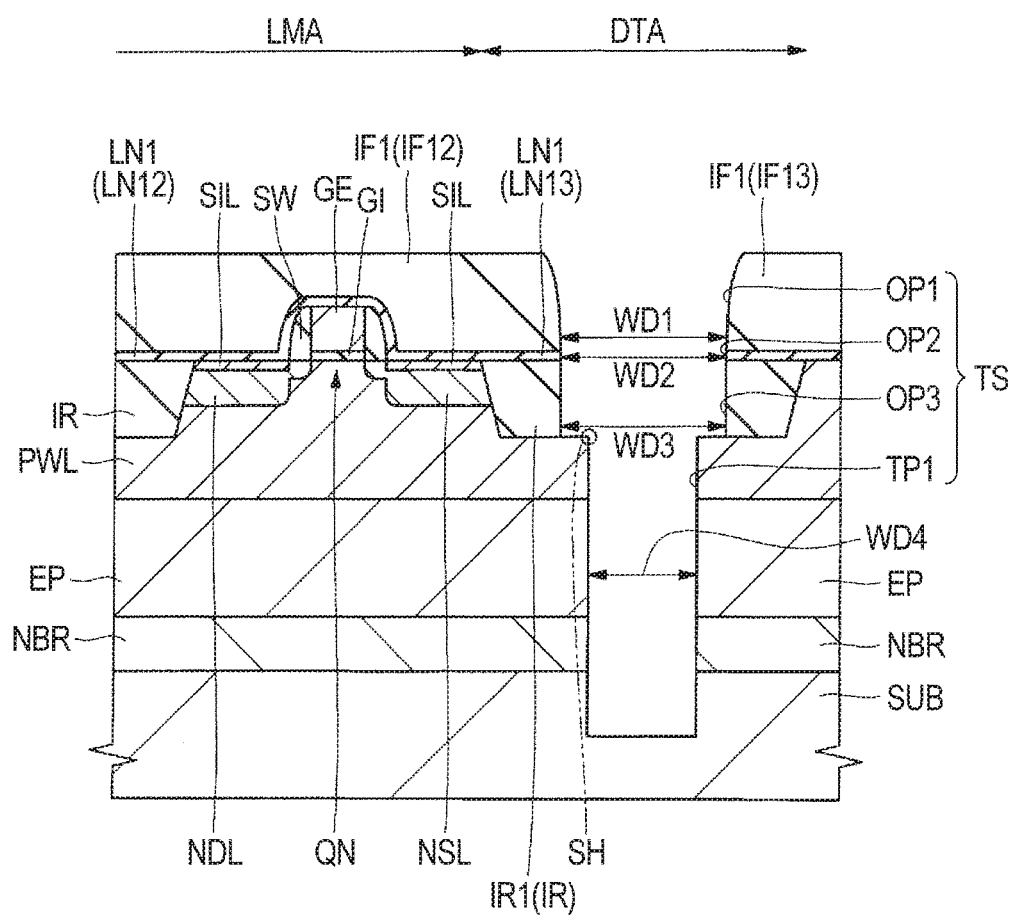
FIG. 22 is a fragmentary cross-sectional view of the semiconductor device of First Embodiment during a manufacturing step thereof.
Figure 23:
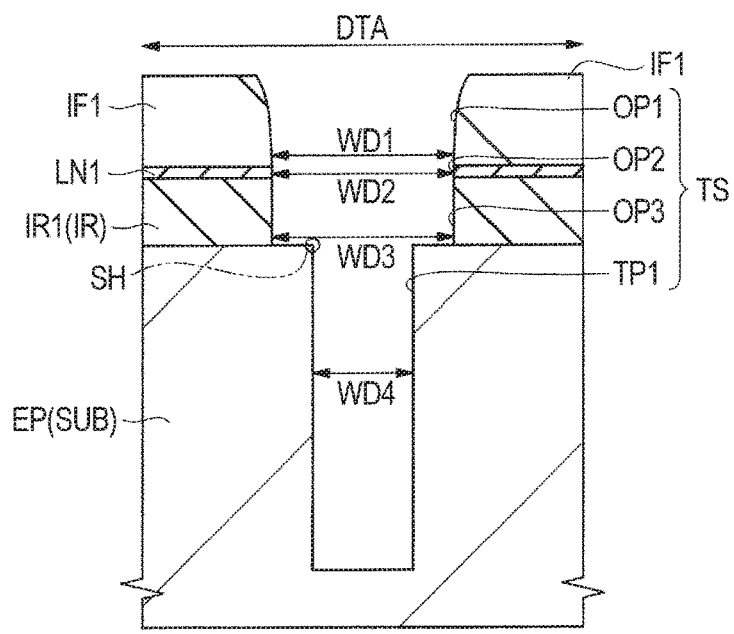
FIG. 23 is a fragmentary cross-sectional view of the semiconductor device of First Embodiment during a manufacturing step thereof.

Next, as shown in FIGS. 22 and 23, the insulating films IF1 and IR1 are etched (Step S25 in FIG. 6). In this Step S25, in the DTI region DTA, a portion of the insulating film IF1 exposed from the opening portion OP1 and a portion of the insulating film IR1 exposed from the opening portion OP3 are etched using the same etching agent.

As described above, the etch rate of the insulating film LN1 by an etching agent to be used for etching of the insulating films IF1 and IR1 is smaller than the etch rate of each of the insulating films IF1 and IR1 by this etching agent. The insulating films IF1 and IR1 can therefore be etched selectively without etching the insulating film LN1 by the etching agent to be used for etching of the insulating films IF1 and IR1.

By etching a portion of the insulating film IF1 exposed from the opening portion OP1 by an etching agent, the insulating film IF1 inside the opening portion OP2 is removed to expose the insulating film LN1 and make the opening width WD1 of the opening portion OP1 equal to the opening width WD2 of the opening portion OP2 or greater than the opening width WD2 of the opening portion OP2. By etching a portion of the insulating film IR1 exposed from the opening portion OP3 by an etching agent, the opening width WD3 of the opening portion OP3 is made equal to the opening width WD2 of the opening portion OP2 or greater than the opening width WD2 of the opening portion OP2.

As a result, the minimum opening width of the opening portions OP1, OP2, and OP3 becomes equal to the opening width WD2 of the opening portion OP2. This makes it possible to prevent or suppress fluctuation of the minimum opening width of the opening portions OP1, OP2, and OP3 among a plurality of the DTI structures DS and thereby improve the shape accuracy.

At this time, the opening portions OP1 having an increased opening width WD1, the opening portion OP2, the opening portion OP3 having an increased opening width WD3, and the trench portion TP1 configure the trench structure TS. By such a trench structure TS, the height position of the upper end of a portion of the trench structure TS having a trench width equal to the trench width WD4 or smaller than the trench width WD4, in other words, the height position of the shoulder portion SH, can be lowered to a height position of the lower surface of the insulating film IR1.

Figure 24:
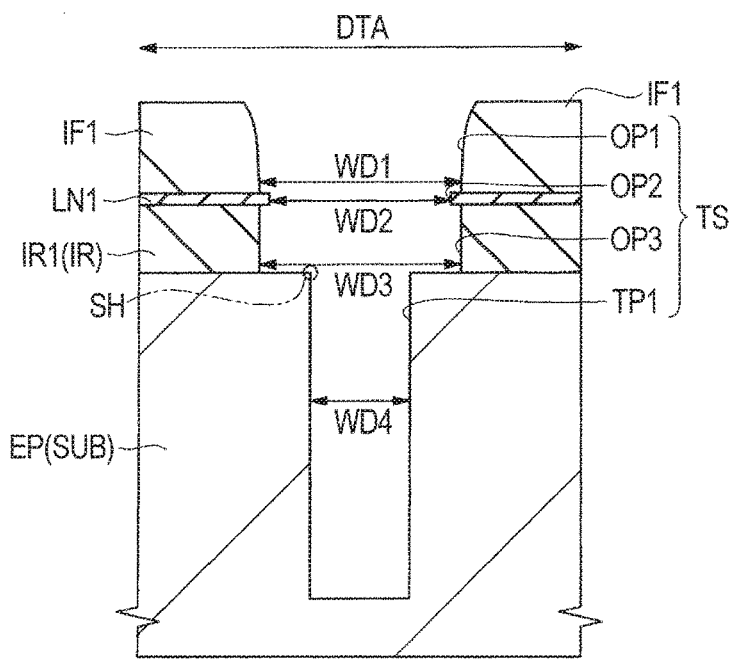
FIG. 24 is a fragmentary cross-sectional view of the semiconductor device of First Embodiment during a manufacturing step thereof.

FIG. 24 shows the opening portion OP1 having an opening width WD1 made greater than the opening width WD2 of the opening portion OP2 and the opening portion OP3 having an opening width WD3 made greater than the opening width WD2 of the opening portion OP2.

In order to lower the height position of the shoulder portion SH to the height position of the lower surface of the insulating film IR1, it is only necessary to make the opening width WD1 of the opening portion OP1 greater than the trench width WD4 of the trench portion TP1. The opening width WD1 of the opening portion OP1 is not necessarily be greater than the opening width WD2 of the opening portion OP2. Similarly, in order to lower the height position of the shoulder portion SH to the height position of the lower surface of the insulating film IR1, it is only necessary to make the opening width WD3 of the opening portion OP3 greater than the trench width WD4 of the trench portion TP1. The opening width WD3 of the opening portion OP3 is not necessarily be greater than the opening width WD2 of the opening portion OP2.

Figure 25:
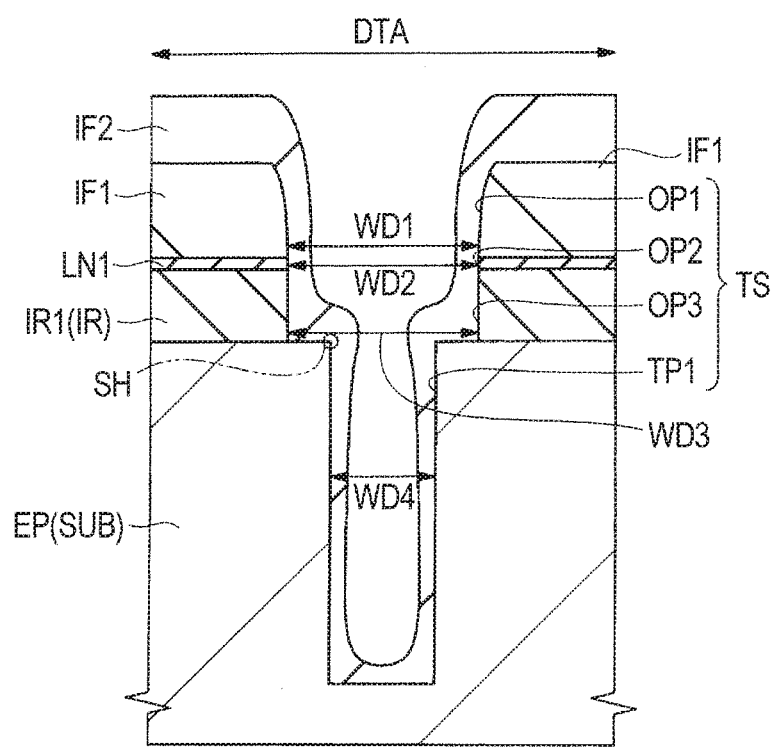
FIG. 25 is a fragmentary cross-sectional view of the semiconductor device of First Embodiment during a manufacturing step thereof.
Figure 26:
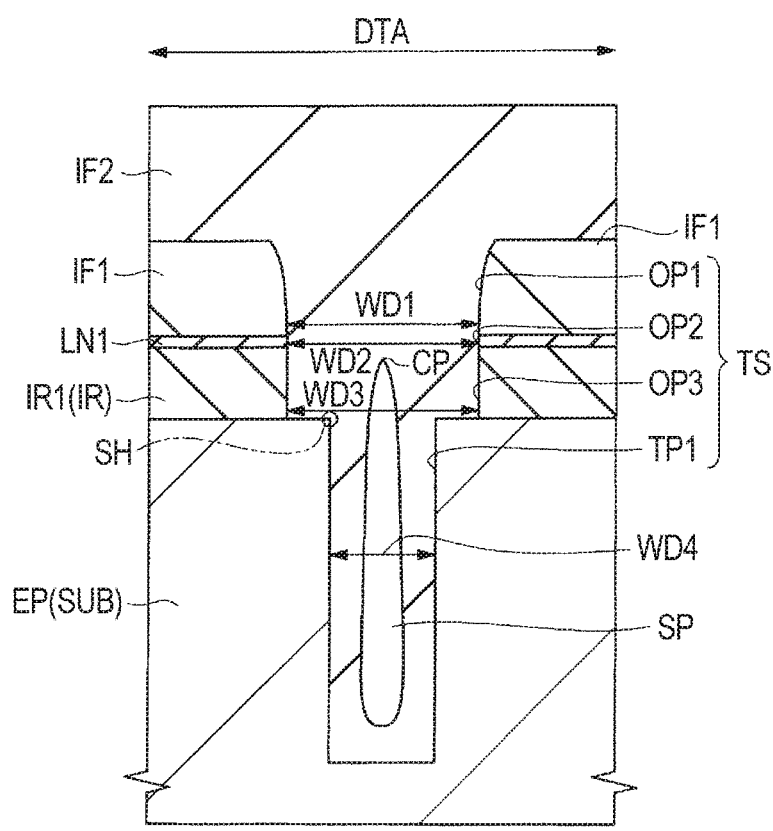
FIG. 26 is a fragmentary cross-sectional view of the semiconductor device of First Embodiment during a manufacturing step thereof.

Next, as shown in FIGS. 25 and 26, an insulating film IF2 is formed (Step S26 in FIG. 6). In this Step S26, in the DTI region DTA, the insulating film IF2 is formed in the trench structure TS, more specifically, in the trench portion TP1, in the opening portion OP3, in the opening portion OP2, in the opening portion OP1, and on the insulating film IF1, for example, by CVD. The trench portion TP1 is therefore closed by the insulating film IF2 while leaving a space SP inside the trench portion TP1. The insulating film IF2 contains silicon and oxygen.

For example, in Step S26, the insulating film IF2 made of a silicon oxide film can be formed by plasma chemical vapor deposition (plasma-enhanced chemical vapor deposition: PECVD) using a gas containing a tetraethoxysilane (TEOS) gas. The silicon oxide film formed by PECVD using a TEOS gas-containing gas will hereinafter be called "PTEOS film".

Alternatively, in Step S26, the insulating film IF2 made of a silicon oxide film can be formed by PECVD using a gas containing a silane (SiH$_4$) gas instead of the TEOS gas. The silicon oxide film formed by PECVD using this SiH$_4$ gas-containing gas will hereinafter be called "P—SiO film".

When the insulating film IF2 made of a PTEOS film or P—SiO film is formed, the thickness of the insulating film IF2 formed at a height position of the side surface of the trench structure TS lower than the shoulder portion SH becomes thicker on the upper side, that is, on the side closer to the shoulder portion SH of the trench structure TS. After formation of the insulating film IF2 is started, the distance between the insulating films IF2 formed on both side surfaces of the trench structure TS become narrowest in the vicinity of the shoulder portion SH during formation as shown in FIG. 25. At the time of formation of the insulating film IF2, therefore, the height position at which the insulating films IF2 formed on both side surfaces of the trench structure TS are brought into contact with each other to start closing of the space SP is substantially equal to the height position of the shoulder portion SH. By further continuing formation of the insulating film IF2, the trench portion TP1 is closed by the insulating film IF2 while leaving the space SP inside the trench portion TP1 as shown in FIG. 26.

As described above, in First Embodiment, the height position of the shoulder portion SH can be lowered to the height position of the lower surface of the insulating film IR1. The higher the height position of the shoulder portion SH, the higher the height position of the space SP at which closing thereof starts at the time of the formation of the insulating film IF2. By lowering the height position of the shoulder portion SH, therefore, the height position of the space SP at which closing thereof starts at the time of the formation of the insulating film IF2 can be lowered, making it possible to lower the height position of the upper end of the space SP, that is, the closing position CP of the space SP.

As the insulating film IF2, the above-mentioned single layer film made of the PTEOS film or P—SiO film can be replaced by an insulating film formed, for example, as a stacked film obtained by stacking a plurality of insulating film layers, for example, three layers. When a stacked film is formed by stacking three insulating film layers, an insulating film made of a silicon oxide film, that is, so-called O$_3$TEOS film is formed on an inner wall of the trench structure TS as the first insulating film layer by CVD using a gas containing an ozone (O$_3$) gas and a tetraethoxysilane (TEOS) gas. Then, an insulating film made of the above-mentioned PTEOS film or P—SiO film is formed, as a second insulating film layer, on the first insulating film layer so as not to close the trench structure TS. Then, an insulating film made of an O$_3$TEOS film similar to that of the first insulating film layer is formed, as a third insulating film layer, on the second insulating film layer. By the third insulating film layer, the trench structure TS is closed while leaving the space SP in the trench structure TS.

The step coverage of the first insulating film layer is relatively high so that the thickness of the first insulating film layer on the inner wall of the trench portion TP1 is substantially uniform irrespective of the height position. The step coverage of the second insulating film layer is, on the other hand, lower than that of the first insulating film layer so that the thickness of the second insulating film layer on the inner wall of the trench portion TP1 is thicker on the upper side, that is, on the side closer to the shoulder portion SH and therefore, the distance between the insulating films IF2 formed on both side surfaces of the trench portion TP1 becomes narrowest in the vicinity of the shoulder portion SH. Further, since the step coverage of the third insulating film layer is higher than that of the second insulating film layer, the closing position CP of the space SP can be lowered to the vicinity of the shoulder portion SH.

Figure 27:
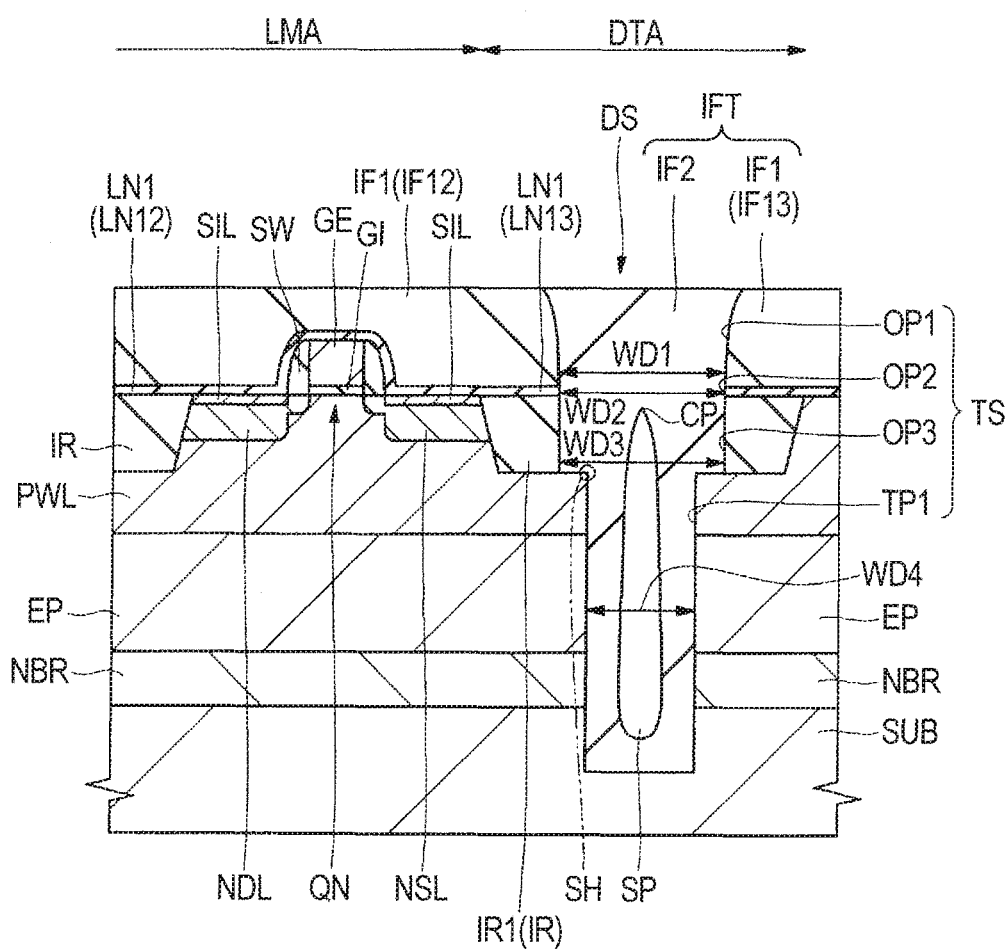
FIG. 27 is a fragmentary cross-sectional view of the semiconductor device of First Embodiment during a manufacturing step thereof.
Figure 28:
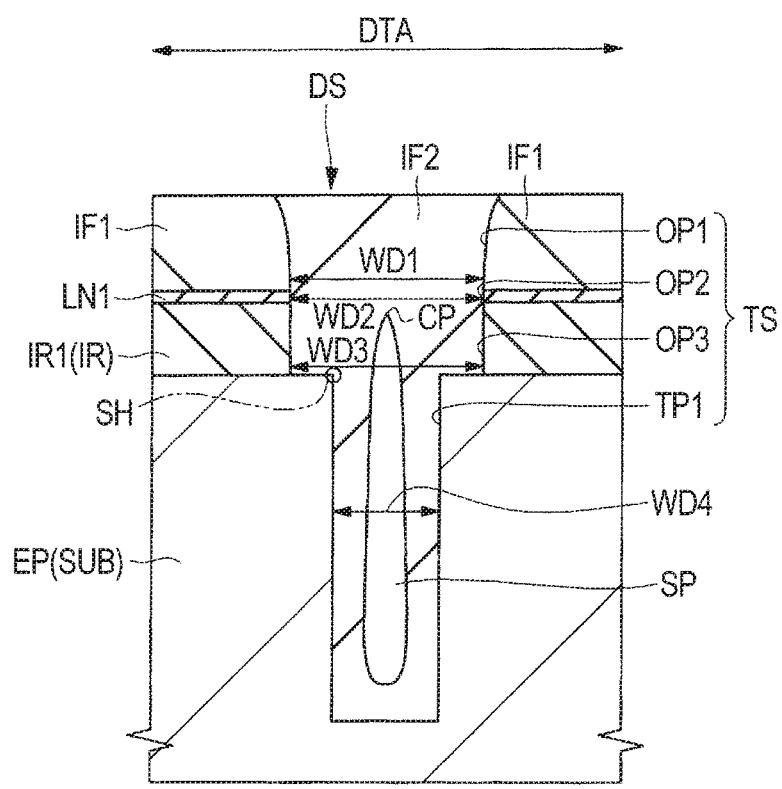
FIG. 28 is a fragmentary cross-sectional view of the semiconductor device of First Embodiment during a manufacturing step thereof.

Next, as shown in FIGS. 27 and 28, the insulating film IF2 is planarized (Step S27 in FIG. 6). In Step S27, the insulating film IF2 is polished to planarize the surface of the insulating film IF2 by CMP or the like. FIGS. 27 and 28 show an example of polishing the insulating film IF2 on the insulating film IF1 and thereby removing it. As a result, as also shown in FIG. 15, the trench structure TS and the insulating film IF2 configure the DTI structure DS.

Figure 30:
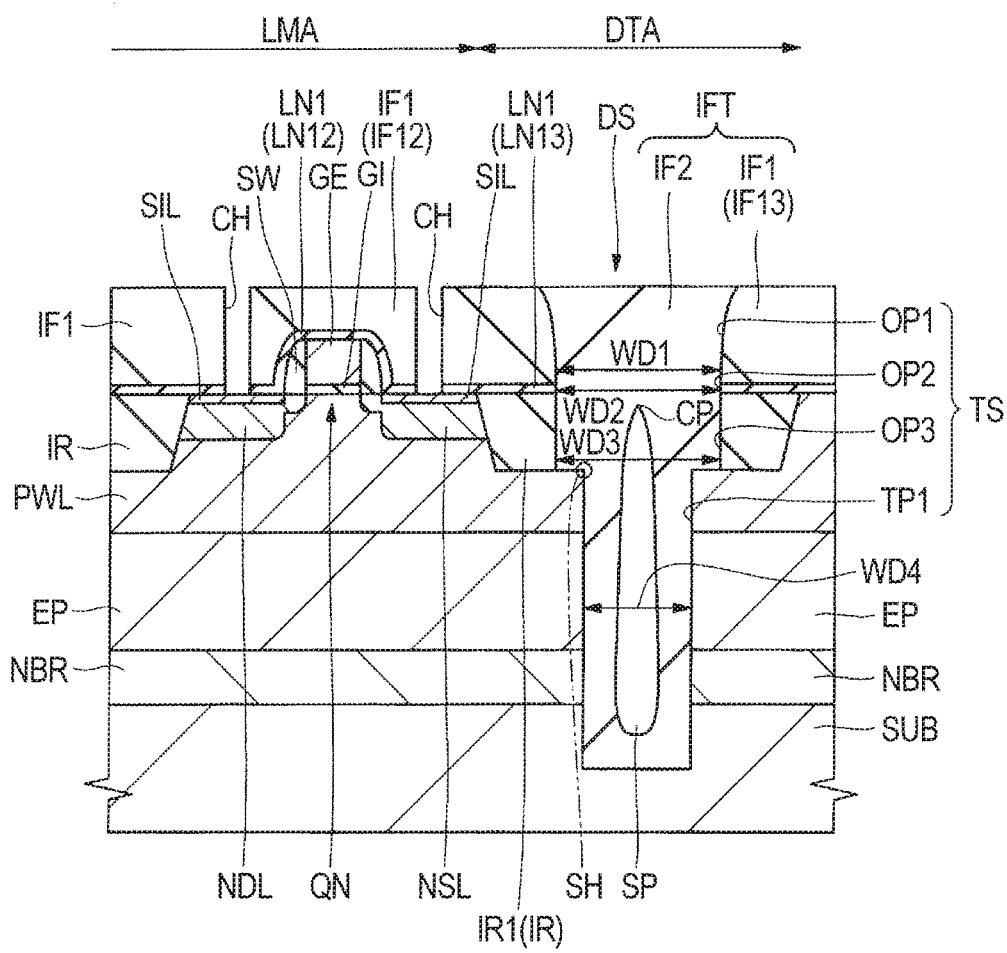
FIG. 30 is a fragmentary cross-sectional view of the semiconductor device of First Embodiment during a manufacturing step thereof.
Figure 31:
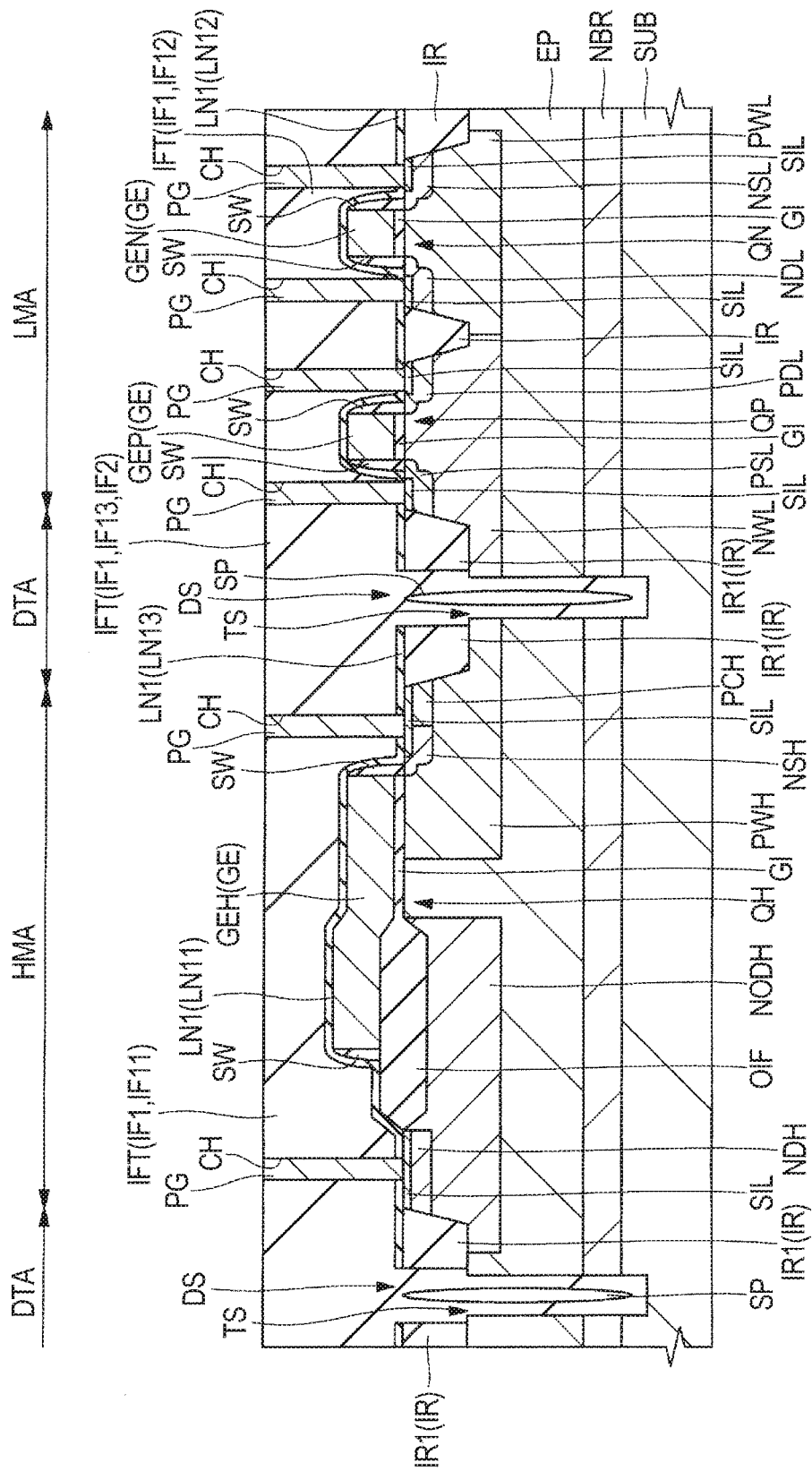
FIG. 31 is a fragmentary cross-sectional view of the semiconductor device of First Embodiment during a manufacturing step thereof.

Next, as shown in FIGS. 29 and 30, a contact hole CH is formed (Step S18 in FIG. 5). In Step S18, in the high breakdown voltage MOS region HMA, a contact hole CH penetrating through the insulating films IF1 and LN1 and reaching each of the n$^+$ type source region NSH, the n$^+$ type drain region NDH, and the p$^+$ type contact region PCH is formed as a hole portion. Further, in the low breakdown voltage MOS region LMA, a contact hole CH reaching each of the p$^+$ type source region PSL, the p$^+$ type drain region PDL, the n$^+$ type source region NSL, and the n$^+$ type drain region NDL is formed as a contact portion.

First, with a resist film (not illustrated) having an opening portion therein as an etching mask, the insulating film IF1 is etched with an etching agent to be used for etching of the insulating film IF1. Next, with a resist film (not illustrated) having therein an opening portion as an etching mask, the insulating film LN1 is etched with an etching agent to be used for etching of the insulating film LN1. As a result, a contact hole CH penetrating through the insulating films IF1 and LN1 and reaching each of the n$^+$ type source region NSH, the n$^+$ type drain region NDH, the p$^+$ type contact region PCH, the p$^+$ type source region PSL, the p$^+$ type drain region PDL, the n$^+$ type source region NSL, and the n$^+$ type drain region NDL is formed.

At the time of etching, the etching rate of the insulating film LN1 by the etching agent to be used for etching of the insulating film IF1 is smaller than the etching rate of the insulating film IF1 by this etching agent. In the high breakdown voltage MOS region HMA and the low breakdown voltage MOS region LMA, at the time of formation of a portion of the contact hole CH that penetrates through the insulating film IF1 and reaches the upper surface of the insulating film LN1, etching by the etching agent to be used for etching of the insulating film IF1 can be terminated at the upper surface of the insulating film LN1 with high accuracy. The contact hole CH can therefore be formed with high shape accuracy.

Next, as shown in FIGS. 31 and 4, a plug PG is formed (Step S19 in FIG. 5). In this Step S19, in the high breakdown voltage MOS region HMA and the low breakdown voltage MOS region LMA, a barrier film made of a titanium nitride film is formed by CVD in the contact hole CH as a hole portion and on the insulating film IF1. Next, a conductor film made of a tungsten film is formed by CVD on the barrier film so as to fill the contact hole CH. Then, an unnecessary portion of the conductor film and the barrier film on the insulating film IFT is removed by CMP or etchback. As a result, a plug PG formed to fill the contact hole CH and including a conductor film made of, for example, a tungsten film can be formed.

The n$^+$ type source region NSH, the n$^+$ type drain region NDH, the p$^+$ type contact region PCH, the p$^+$ type source region PSL, the p$^+$ type drain region PDL, the n$^+$ type source region NSL, and the n$^+$ type drain region NDL have, on the respective surfaces thereof, the silicide layer SIL as a conductor portion. This means that the contact hole CH reaches the upper surface of the silicide layer SIL. The plug formed to fill the contact hole CH therewith is therefore electrically coupled to the silicide layer SIL.

Next, as shown in FIG. 3, a first-layer wiring M1 composed mainly of, for example, an aluminum (Al) alloy film is formed on the insulating film IFT made of the insulating films IF1 and IF2. The wiring M1 is electrically coupled to the plug PG in the contact hole CH. Then, an interlayer insulating film IL1 made of, for example, a silicon oxide film is formed on the insulating film IFT, followed by formation of the first-layer wiring M1 and the plug PG1 penetrating through the interlayer insulating film IL1 and reaching the wiring M1.

Next, a second-layer wiring M2 composed mainly of, for example, an Al alloy film is formed on the interlayer insulating film IL1. The wiring M2 is electrically coupled to the plug PG1 that penetrates through the interlayer insulating film IL1. Then, an interlayer insulating film IL2 made of, for example, a silicon oxide film is formed on the interlayer insulating film IL1 and the second-layer wiring M2, followed by formation of a plug PG2 penetrating through the interlayer insulating film IL2 and reaching the wiring M2.

Next, a third-layer wiring M3 composed mainly of, for example, an Al alloy film is formed on the interlayer insulating film IL2. The wiring M3 is electrically coupled to the plug PG2 that penetrates through the interlayer insulating film IL2. Then, an interlayer insulating film IL3 made of, for example, a silicon oxide film is formed on the interlayer insulating film IL2 and the third-layer wiring M3. In such a manner, the semiconductor device shown in FIG. 3 is formed.

<Closing Position>

Figure 32:
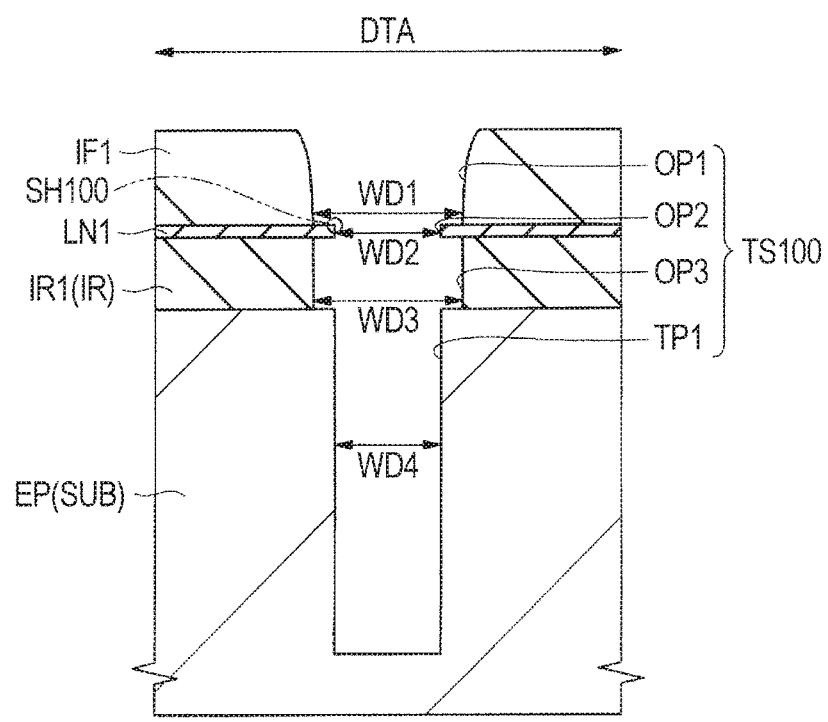
FIG. 32 is a fragmentary cross-sectional view of a semiconductor device of Comparative Example during a manufacturing step thereof.
Figure 33:
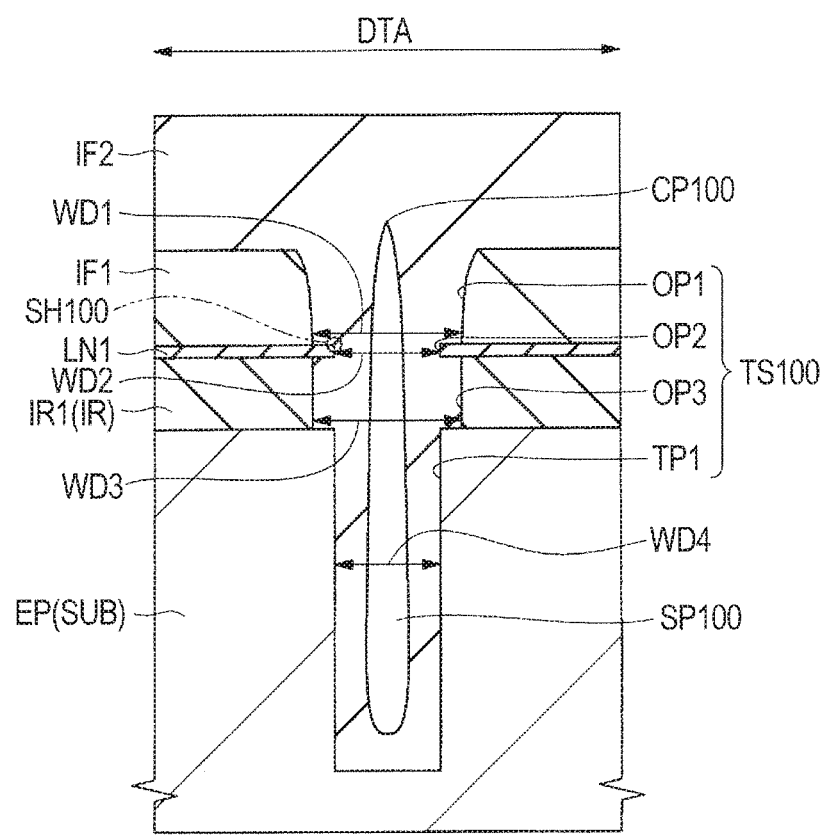
FIG. 33 is a fragmentary cross-sectional view of the semiconductor device of Comparative Example during a manufacturing step thereof.
Figure 34:
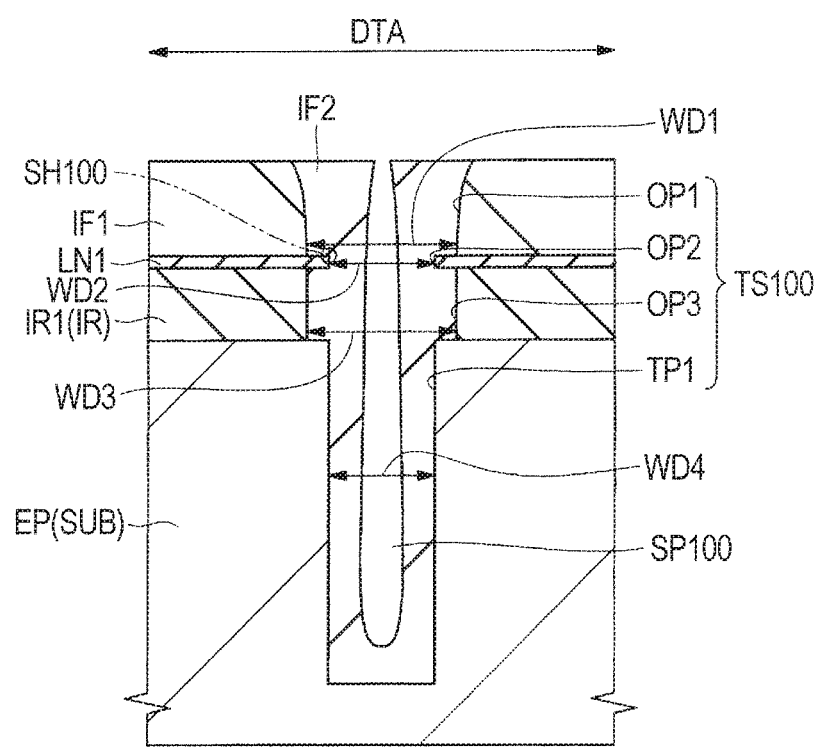
FIG. 34 is a fragmentary cross-sectional view of the semiconductor device of Comparative Example during a manufacturing step thereof.

Next, a closing position of a space at the time when a trench portion is closed while leaving a space in the trench portion will be described in comparison with a semiconductor device of Comparative Example. FIGS. 32 to 34 are fragmentary cross-sectional views of the semiconductor device of Comparative Example during manufacturing steps thereof.

With regard to the semiconductor device of Comparative Example, for example, when an opening portion OP2 is formed by performing a step similar to Step S21 shown in FIG. 6 in manufacturing steps similar to those of the semiconductor device of First Embodiment, the opening portion OP2 is formed so as to make the opening width WD2 of the opening portion OP2 equal to the trench width WD4 of the trench portion TP1 which will be formed in a later step. In a trench structure TS100 formed by performing steps similar to Steps S22 to S24 shown in FIG. 6, the opening width WD2 of the opening portion OP2 is equal to the trench width WD4 of the trench portion TP1 as shown in FIG. 32.

Then, when the opening width WD1 of the opening portion OP1 and the opening width WD3 of the opening portion OP3 are widened by carrying out a step similar to Step S25 shown in FIG. 6, the opening width WD1 of the opening portion OP1 and the opening width WD3 of the opening portion OP3 are greater than the trench width WD4 of the trench portion TP1 as shown in FIG. 32. Since the opening width WD2 of the opening portion OP2 is equal to the trench width WD4 of the trench portion TP1, however, a height position of the upper end of a portion of the trench structure TS100 having a trench width equal to the trench width WD4 or smaller than the trench width WD4, in other words, the height position of the shoulder portion SH100 becomes equal to the height position of the upper surface of the insulating film LN1 and higher than the height position of the lower surface of the insulating film IR1.

As described above, the higher the height position of this shoulder portion SH100, the higher the height position of the space SP100 at which closing thereof starts at the time of formation of the insulating film IF2. In Comparative Example, therefore, due to heightening of the height position of the shoulder portion SH100, the height position of the space SP100 at which closing thereof starts inevitably becomes high as shown in FIG. 33 at the time when a step similar to Step S26 shown in FIG. 6 is performed to form the insulating film IF2. In Comparative Example, the closing position CP100 of the space SP100, that is, the height position of the upper end of the space SP100 cannot therefore be lowered. In Comparative Example, the trench portion TP1 can be closed while leaving the space SP100 in the trench portion TP1 by forming the insulating film IF2 in the trench TP1, but there is a risk of the closing position CP100 of the space SP100 becoming higher than the desired position.

When the closing position CP100 of the space SP100 becomes higher than the desired position, the height position of the surface of the insulating film IF2 is lower than the closing position CP100 of the space SP100 when after formation of the insulating film IF2, the insulating film IF2 thus formed is polished to planarize the surface of the insulating film IF2. This may expose the space SP100 from the surface of the insulating film IF2 as shown in FIG. 34. It may lead to invasion of a polishing slurry into the space SP100 or invasion of a washing liquid into the space SP100 in a washing step conducted later. If such invasion occurs, foreign matters are generated due to blowing-out, from the space SP100, of the slurry or washing liquid that has entered the space SP100 and the semiconductor device thus manufactured inevitably has a defect in the shape thereof and as a result, has deteriorated performance.

In order to prevent the space SP100 from exposing from the surface of the insulating film IF2, the height position of the surface of the insulating film IF2 after planarization of the surface of the insulating film IF2 should be heightened. This leads to an increase in aspect ratio, that is, a depth-to-width ratio of the contact hole CH (refer to FIGS. 29 and 30) that penetrates through the insulating films IF1 and LN1 and reaches, for example, the n$^+$ type source region NSL. This prevents the contact hole CH and the plug PG (refer to FIGS. 31 and 4) from being formed with good shape accuracy and the semiconductor device thus obtained may have deteriorated performance.

<Main Characteristics and Advantage of Present Embodiment>

The semiconductor device of First Embodiment has the insulating film IR1 formed on the main surface of the semiconductor substrate SUB and the insulating film LN1 formed on the insulating film IR1. Further, the semiconductor device of First Embodiment has the opening portion OP2 that penetrates through the insulating film LN1 and reaches the insulating film IR1, the opening portion OP3 that penetrates through a portion of the insulating film IR1 exposed from the opening portion OP2 and reaches the semiconductor substrate SUB, and the trench portion TP1 formed in a portion of the semiconductor substrate SUB exposed from the opening portion OP3. The opening width WD2 of the opening portion OP2 and the opening width WD3 of the opening portion OP3 are greater than the trench width WD4 of the trench portion TP1. In addition, the trench portion TP1 is closed by the insulating film IF2 while leaving the space SP in the trench portion TP1.

Due to such a structure, the height position of the upper end of a portion of the trench structure TS having a trench width equal to the trench width WD4 or smaller than the trench width WD4, that is, the height position of the shoulder portion SH, can be lowered to the height position of the lower surface of the insulating film IR1. The higher the height position of this shoulder portion SH, the higher the height position of the space SP at which closing thereof starts at the time of the formation of the insulating film IF2. By lowering the height of the shoulder portion SH, the height position of the space SP at which closing thereof starts at the time of the formation of the insulating film IF2 can be lowered so that the height position of the upper end of the space SP, that is, the closing position CP of the space SP can be lowered.

Thus, in First Embodiment, the closing position CP of the space SP can be lowered to a desired position easily. This makes it possible to prevent or suppress the height position of the surface of the insulating film IF2 from becoming lower than the closing position CP of the space SP, for example, at the time of polishing the insulating film IF2 to planarize the surface of the insulating film FI2. In addition, this makes it possible to prevent or suppress a polishing slurry from entering the space SP exposed from the surface of the insulating film IF2 and prevent or suppress a washing liquid from entering the space SP in a washing step to be conducted later; and therefore makes it possible to prevent or suppress the slurry or washing liquid that has entered the space SP from blowing out from the space SP and forming foreign matters. As a result, the semiconductor device thus obtained has no defects in shape and can have improved performance.

Further, since the height position of the surface of the insulating film IF2 after planarization of the surface of the insulating film IF2 can be lowered, an aspect ratio, that is, a depth-to-width ratio of the contact hole CH (refer to FIGS. 29 and 30) that penetrates through the insulating films IF1 and LN1 and reaches, for example, the n$^+$ type source region NSL can be decreased. As a result, the contact hole CH and the plug PG (refer to FIGS. 31 and 4) can be formed with good shape accuracy and the semiconductor device thus obtained can have improved performance.

Second Embodiment

In the method of manufacturing a semiconductor device according to First Embodiment, the formation of the opening portion OP2 is followed by the formation of the insulating film IF1. In a method of manufacturing a semiconductor device according to Second Embodiment, on the other hand, the formation of the insulating film IF1 is followed by the formation of the opening portion OP2.

The configuration of the semiconductor device of Second Embodiment is similar to that of the semiconductor device of First Embodiment so that description on it is omitted.
<Manufacturing Method of Semiconductor Device>

Figure 35:
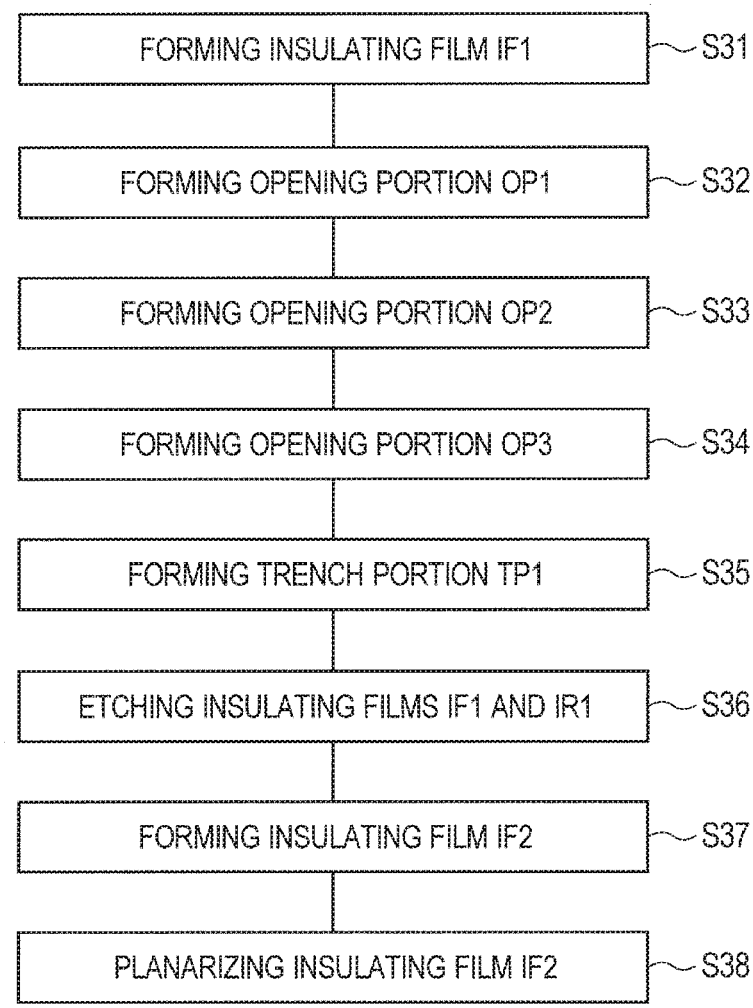
FIG. 35 is a manufacturing process flow chart showing some of manufacturing steps of a semiconductor device of Second Embodiment.

Next, the method of manufacturing a semiconductor device according to Second Embodiment will be described. FIG. 35 is a manufacturing process flow chart showing some of manufacturing steps of the semiconductor device of Second Embodiment. FIG. 35 shows manufacturing steps included in Step S17 of FI. 5 when the manufacturing process flow shown in FIG. 5 is carried out as manufacturing steps of the semiconductor device of Second Embodiment. FIGS. 36 to 42 are fragmentary cross-sectional views of the semiconductor device of Second Embodiment during manufacturing steps thereof. FIGS. 36 to 42 are enlarged cross-sectional views showing the configuration near the DTI structure.

Also in Second Embodiment, similar to First Embodiment, the DTI structure DS may be formed between the LDMOSFETQH and the p channel MISFETQP or may be formed near various other elements.

Also in Second Embodiment, an insulating film LN1 is formed by carrying out steps similar to those (Steps S11 to S16 in FIG. 5) described in First Embodiment referring to FIGS. 7 to 14.

Next, the DTI structure DS is formed (Step S17 in FIG. 5). In Second Embodiment, Step S17 in FIG. 5 includes Steps S31 to S38 in FIG. 35. Steps S31 to S38 in FIG. 35 will hereinafter be described referring to FIGS. 36 to 42 and FIGS. 25 to 28.

Figure 36:
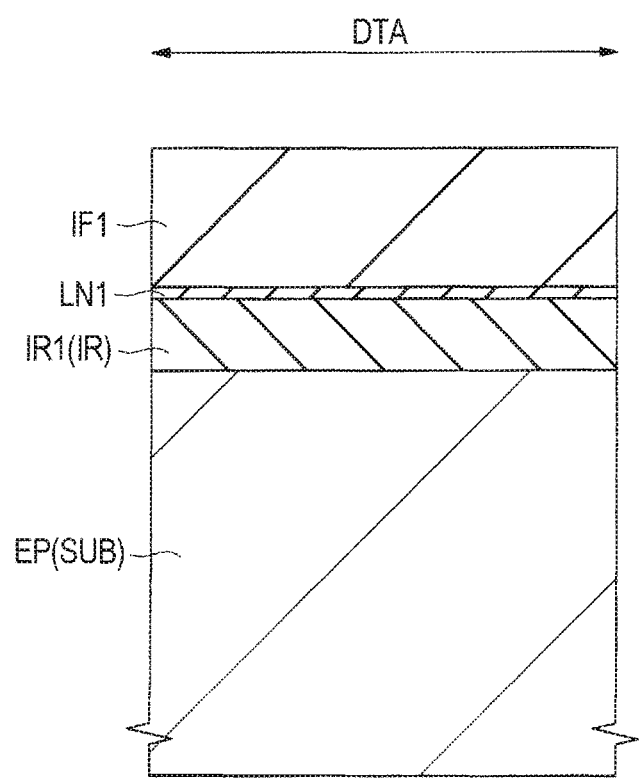
FIG. 36 is a fragmentary cross-sectional view of the semiconductor device of Second Embodiment during a manufacturing step thereof.

First, as shown in FIG. 36, an insulating film IF1 is formed (Step S31 in FIG. 35). In Step S31, in the DTI region DTA, that is, a region in which the DTI structure DS is to be formed, an insulating film IF1 is formed on the insulating film LN1. The insulating film IF1 contains silicon and oxygen. More specifically, the insulating film IF1 can be formed by carrying out a step similar to Step S22 of First Embodiment shown in FIG. 6. Although not illustrated, also in the high breakdown voltage MOS region HMA and the low breakdown voltage MOS region LMA (refer to FIG. 13), the insulating film IF1 is formed as in First Embodiment.

Figure 37:
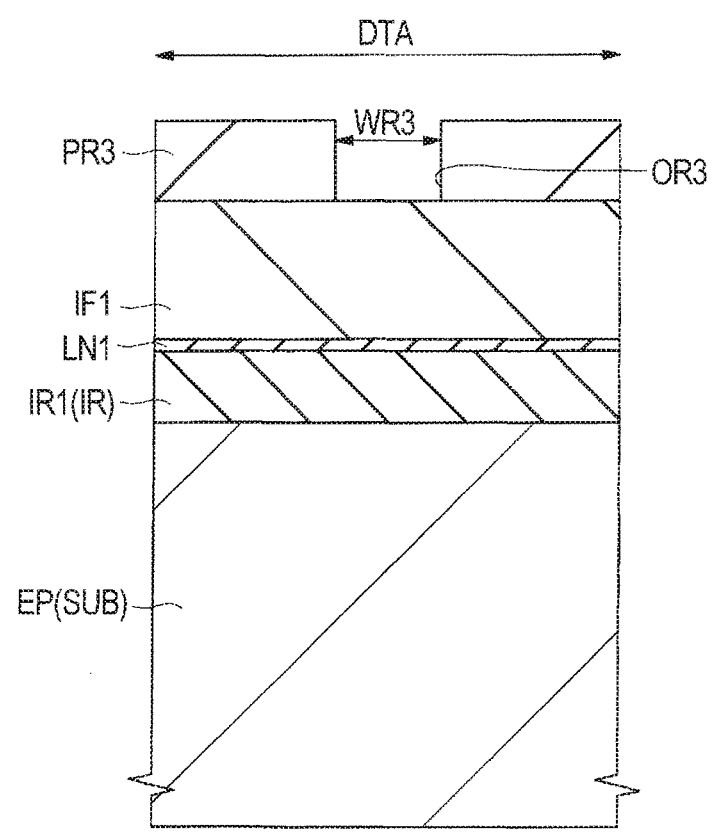
FIG. 37 is a fragmentary cross-sectional view of the semiconductor device of Second Embodiment during a manufacturing step thereof.
Figure 38:
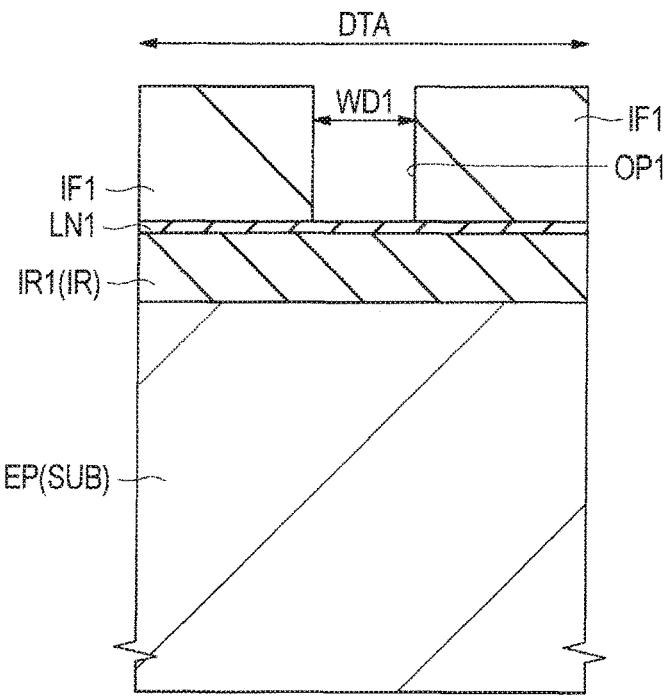
FIG. 38 is a fragmentary cross-sectional view of the semiconductor device of Second Embodiment during a manufacturing step thereof.

Next, as shown in FIGS. 37 and 38, an opening portion OP1 is formed (Step S32 in FIG. 35). In this Step S32, in the DTI region DTA, an opening portion OP1 that penetrates through the insulating film IF1 and reaches the upper surface of the insulating film LN1 is formed.

First, a resist film PR3 made of photoresist is formed on the insulating film IF1. After pattern exposure of the resulting resist film PR3, it is developed. As a result, as shown in FIG. 37, an opening portion OR3 that penetrates through the resist film PR3 and reaches the upper surface of the insulating film IF1 is formed. The opening width WR3 of the opening portion OR3 is determined, depending on the opening width WD1 of the opening portion OP1. For example, an opening width WR2 of an opening portion OR2 is equal to the opening width WD1 (refer to FIG. 38) of the opening portion OP1 formed in Step S32.

Next, with the resist film PR3 having therein the opening portion OR3 as an etching mask, a portion of the insulating film IF1 exposed from the bottom surface of the opening portion OR3 is etched. Then, the resist film PR3 having therein the opening portion OR3 is removed, for example, by asking. As a result, the opening portion OP1 that penetrates through the insulating film IF1 and reaches the upper surface of the insulating film LN1 is formed as shown in FIG. 38.

Figure 39:
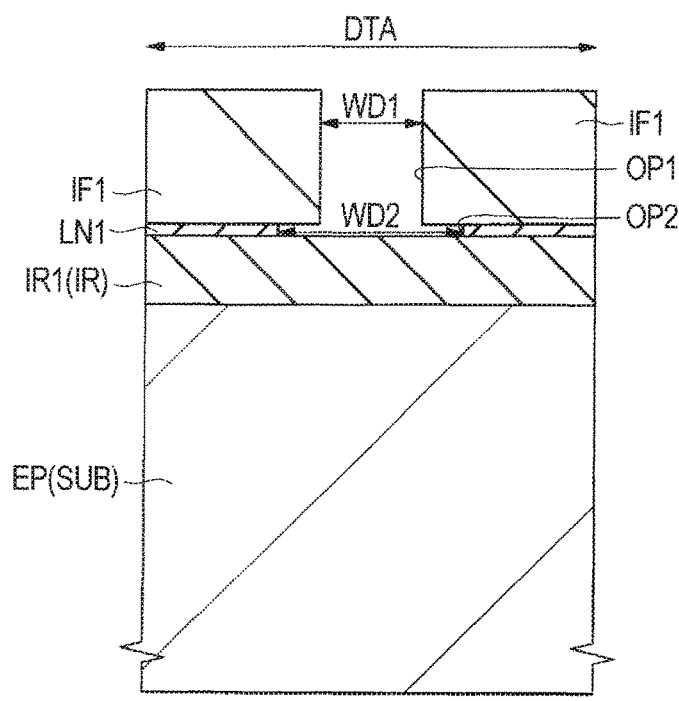
FIG. 39 is a fragmentary cross-sectional view of the semiconductor device of Second Embodiment during a manufacturing step thereof.

Next, as shown in FIG. 39, an opening portion OP2 is formed (Step S33 in FIG. 35). In this Step S33, in the DTI region DTA, an opening portion OP2 that penetrates through a portion of the insulating film LN1 exposed from the bottom surface of the opening portion OP1 and reaches the upper surface of the insulating film IR1 is formed.

More specifically, with the insulating film IF1 having therein the opening portion OP1 as an etching mask, a portion of the insulating film LN1 exposed from the bottom surface of the opening portion OP1 is etched with an etching agent. As a result, the opening portion OP2 that penetrates through the portion of the insulating film LN1 exposed from the bottom surface of the opening portion OP1 and reaches the upper surface of the insulating film IR1 is formed.

In this Step S33, the insulating film LN1 is isotropically etched by an etching agent. The etch rate of the insulating film IF1 by an etching agent to be used in this Step S33 and the etch rate of the insulating film IR1 by this etching agent are smaller than the etch rate of the insulating film LN1 by this etching agent. After formation of the opening portion OP2 that penetrates through a portion of the insulating film LN1 exposed from the bottom surface of the opening portion OP1 and reaches the upper surface of the insulating film IR1, the side surface of a portion of the insulating film LN1 exposed to the inside of the opening portion OP2 retreats from the side surface of a portion of the insulating film IF1 exposed to the inside of the opening portion OP1 in the direction of the opening width WD2. In short, the side surface of the opening portion OP2 retreats outward from the side surface of the opening portion OP1 in the direction of the opening width WD2. As a result, the opening portion OP2 is formed so that the opening width WD2 of the opening portion OP2 becomes greater than the opening width WD1 of the opening portion OP1.

When the insulating films IF1 and IR1 each contain silicon and oxygen and the insulating film LN1 contains silicon and nitrogen, wet etching can be performed as isotropic etching and a phosphoric acid-containing etchant can be used as the etching agent. As a result, compared with an etch rate of the insulating film LN1, the etch rate of each of the insulating films IF1 and IR1 can be made considerably smaller. At the time of etching the insulating film LN1 to form the opening portion OP2, therefore, it is possible to prevent etching of the insulating film IF1 exposed to the inside of the opening portion OP1 and the insulating film IR1 exposed from the bottom surface of the opening portion OP2.

Figure 40:
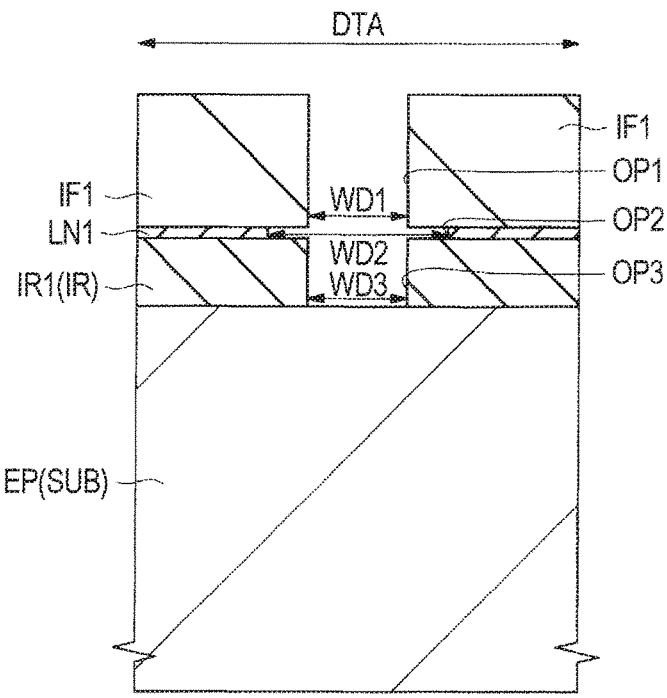
FIG. 40 is a fragmentary cross-sectional view of the semiconductor device of Second Embodiment during a manufacturing step thereof.

Next, as shown in FIG. 40, an opening portion OP3 is formed (Step S34 in FIG. 35). In this Step S34, in the DTI region DTA, an opening portion OP3 is formed by anisotropically etching the insulating film IR1 with the insulating film IF1 having therein the opening portion OP1 as an etching mask.

In this Step S34, the opening portion OP3 is formed by anisotropically etching the insulating film IR1 so as to make the opening width WD3 of the opening portion OP3 equal to the opening width WD1 of the opening portion OP1. The opening width WD1 of the opening portion OP1 is smaller than the opening width WD2 of the opening portion OP2. In this Step S34, therefore, the opening portion OP3 is formed so as to make the opening width WD3 of the opening portion OP3 smaller than the opening width WD2 of the opening portion OP2. This means, in Step S34, the opening portion OP3 is formed so that the side surface of a portion of the insulating film LN1 exposed to the inside of the opening portion OP2 retreats from the side surface of a portion of the insulating film IR1 exposed to the inside of the opening portion OP3 in the direction of the opening width WD2. In other words, the opening portion OP3 is formed so that the side surface of the opening portion OP2 retreats outward from the side surface of the opening portion OP3 in the direction of the opening width WD2.

Figure 41:
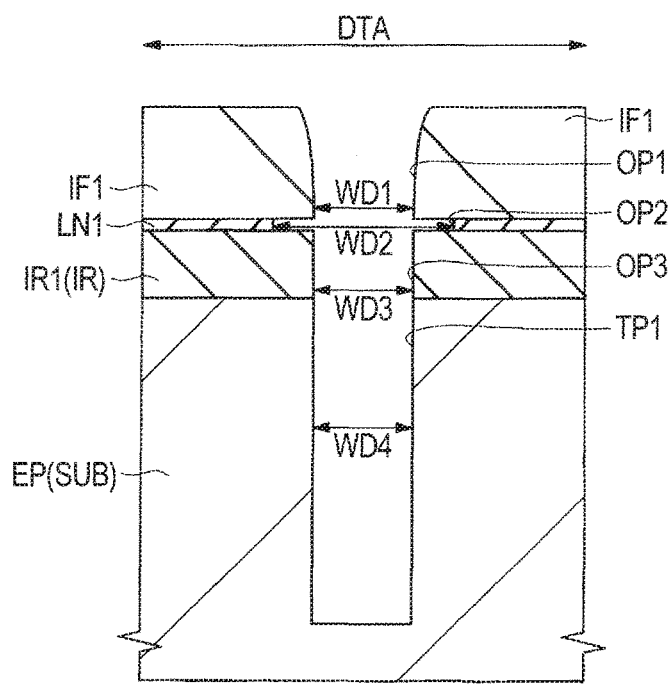
FIG. 41 is a fragmentary cross-sectional view of the semiconductor device of Second Embodiment during a manufacturing step thereof.

Next, as shown in FIG. 41, a trench portion TP1 is formed (Step S35 in FIG. 35). In this Step S35, in the DTI region DTA, with insulating film IF1 having therein the opening portion OP1 and the insulating film IR1 having therein the opening portion OP3 as etching masks, the semiconductor substrate SUB comprised of the p⁻ type epitaxial layer EP and the like exposed from the bottom surface of the opening portion OP3 is etched by dry etching or the like. As a result, a trench portion TP1 penetrating through the p⁻ type epitaxial layer EP and the like exposed from the bottom surface of the opening portion OP3 and reaching the middle of the semiconductor substrate SUB in the thickness direction is formed on the upper surface of the semiconductor substrate SUB. The upper end of the trench portion TP1 is communicated with the lower end of the opening portion OP3.

A specific method of forming the trench portion TP1 in Step S35 can be performed in a manner similar to the method of forming the trench portion TP1 in Step S24 described in First Embodiment referring to FIG. 6.

As described above, the opening width WD3 of the opening portion OP3 is smaller than the opening width WD2 of the opening portion OP2. The trench width WD4 of the trench portion TP1 is equal to the opening width WD3 of the opening portion OP3. In Step S35, therefore, the trench portion TP1 is formed so that the trench width WD4 of the trench portion TP1 becomes smaller than the opening width WD2 of the opening portion OP2. Described specifically, the side surface of a portion of the insulating film LN1 exposed to the inside of the opening portion OP2 retreats from the side surface of a portion of the semiconductor substrate SUB exposed to the inside of the trench portion TP1 in the direction of the opening width WD2. In other words, the trench portion TP1 is formed so that the side surface of the opening portion OP2 retreats outward from the side surface of the trench portion TP1 in the direction of the opening width WD2.

Figure 42:
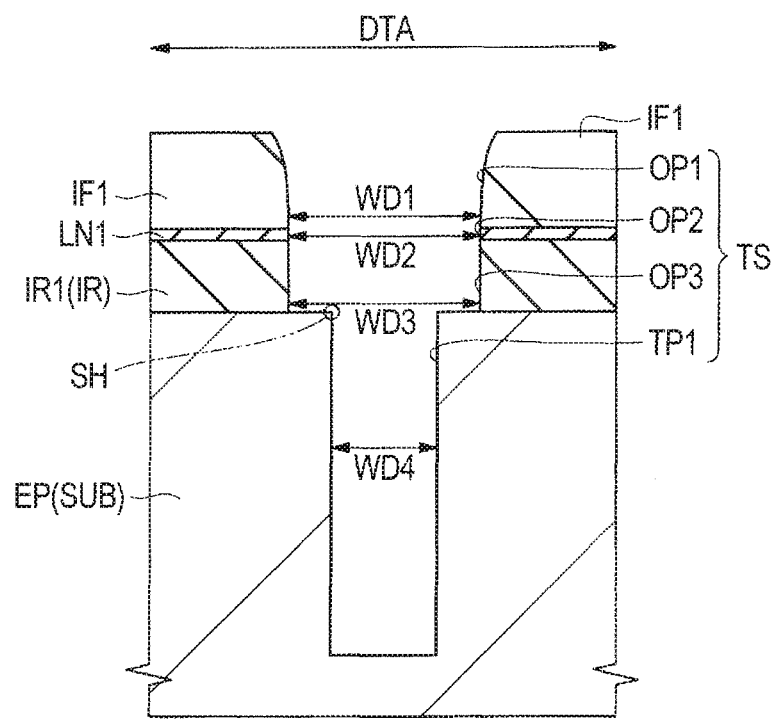
FIG. 42 is a fragmentary cross-sectional view of the semiconductor device of Second Embodiment during a manufacturing step thereof.

Next, as shown in FIG. 42, the insulating films IF1 and IR1 are etched (Step S36 in FIG. 35). In this Step S36, in the DTI region DTA, a portion of the insulating film IF1 exposed from the opening portion OP1 and a portion of the insulating film IR1 exposed from the opening portion OP3 are etched with the same etching agent.

As in First Embodiment, the etch rate of the insulating film LN1 by an etching agent to be used for etching of the insulating films IF1 and IR1 is smaller than the etch rate of each of the insulating films IF1 and IR1 by this etching agent. The insulating films IF1 and IR1 can be etched selectively without etching the insulating film LN1 by the etching agent to be used for etching of the insulating films IF1 and IR1.

By etching the portion of the insulating film IF1 exposed from the opening portion OP1 by the etching agent, the opening width WD1 of the opening portion OP1 is made equal to the opening width WD2 of the opening portion OP2 or is made greater than the opening width WD2 of the opening portion OP2. By etching the portion of the insulating film IR1 exposed from the opening portion OP3 by the etching agent, the opening width WD3 of the opening portion OP3 is made equal to the opening width WD2 of the opening portion OP2 or is made greater than the opening width WD2 of the opening portion OP2.

As a result, the minimum opening width of the opening portions OP1, OP2, and OP3 becomes equal to the opening width WD2 of the opening portion OP2. This therefore makes it possible to prevent or suppress fluctuation in the minimum opening width of the opening portions OP1, OP2, and OP3 among a plurality of the DTI structures DS, leading to improvement in the shape accuracy.

At this time, the opening portion OP1 having an increased opening width WD1, the opening portion OP2, the opening portion OP3 having an increased opening width WD3, and the trench portion TP1 configure the trench structure TS. By such a trench structure TS, the height position of the upper end of a portion of the trench structure TS having a trench width equal to the trench width WD4 or smaller than the trench width WD4, that is, the height position of the shoulder portion SH can be lowered to the height position of the lower surface of the insulating film IR1.

A cross-sectional view when the opening width WD1 of the opening portion OP1 is made greater than the opening width WD2 of the opening portion OP2 and the opening width WD3 of the opening portion OP3 is made greater than the opening width WD2 of the opening portion OP2 is the same as the cross-sectional view shown in FIG. 24.

In order to lower the height position of the shoulder portion SH to the height position of the lower surface of the insulating film IR1, it is only necessary that the opening width WD1 of the opening portion OP1 is greater than the trench width WD4 of the trench portion TP1. The opening width WD1 is not necessarily greater than the trench width WD2 of the opening portion OP2. Similarly, in order to lower the height position of the shoulder portion SH to the height position of the lower surface of the insulating film IR1, it is only necessary that the opening width WD3 of the opening portion OP3 is greater than the trench width WD4 of the trench portion TP1. The opening width WD3 is not necessarily greater than the opening width WD2 of the opening portion OP2.

Next, an insulating film IF2 is formed (Step S37 in FIG. 35). In this Step S37, in the DTI region DTA, a step similar to Step S26 of First Embodiment shown in FIG. 6 is performed to close the trench portion TP1 by the insulating film IF2 as shown in FIG. 26 while leaving the space SP in the trench portion TP1. The insulating film IF2 contains silicon and oxygen.

As described above, also in Second Embodiment, similar to First Embodiment, the height position of the shoulder portion SH can be lowered to the height position of the lower surface of the insulating film IR1. The higher the height position of the shoulder portion SH, the higher the height position of the space SP at which closing thereof starts at the time of the formation of the insulating film IF2. By lowering the height position of the shoulder portion SH, therefore, the height position of the space SP at which closing thereof starts at the time of the formation of the insulating film IF2 can be lowered and the height position of the upper end of the space SP, that is, the closing position CP of the space SP can be lowered.

Next, the insulating film IF2 is planarized (Step S38 in FIG. 35). In this Step S38, a step similar to Step S27 of First Embodiment shown in FIG. 6 is performed to planarize the surface of the insulating film IF2 as shown in FIGS. 27 and 28. As a result, a DTI structure DS is formed by the trench structure TS and the insulating film IF2.

In First Embodiment, in the steps of forming the DTI structure DS (Step S21 to Step S27 in FIG. 6), the step of subjecting a resist film to pattern exposure and thereby forming an opening portion is performed twice (Step S21 and Step S23 in FIG. 6). In Second Embodiment, on the other hand, in the steps of forming the DTI structure DS (Step S31 to Step S38 in FIG. 35), the step of subjecting a resist film to pattern exposure and thereby forming an opening portion is performed only once (Step 32 in FIG. 35). This makes it possible to reduce the number of manufacturing steps of a semiconductor device.

Then, steps similar to those described in First Embodiment referring to FIGS. 29 to 31 (Step S18 and Step S19 in FIG. 5) and steps thereafter are performed to form the semiconductor device shown in FIG. 3.

<First Modification Example of Manufacturing Method of Semiconductor Device>

As a first modification example of the method of performing Step S33 in FIG. 35 to form the opening portion OP2, the following method can be performed.

Figure 43:
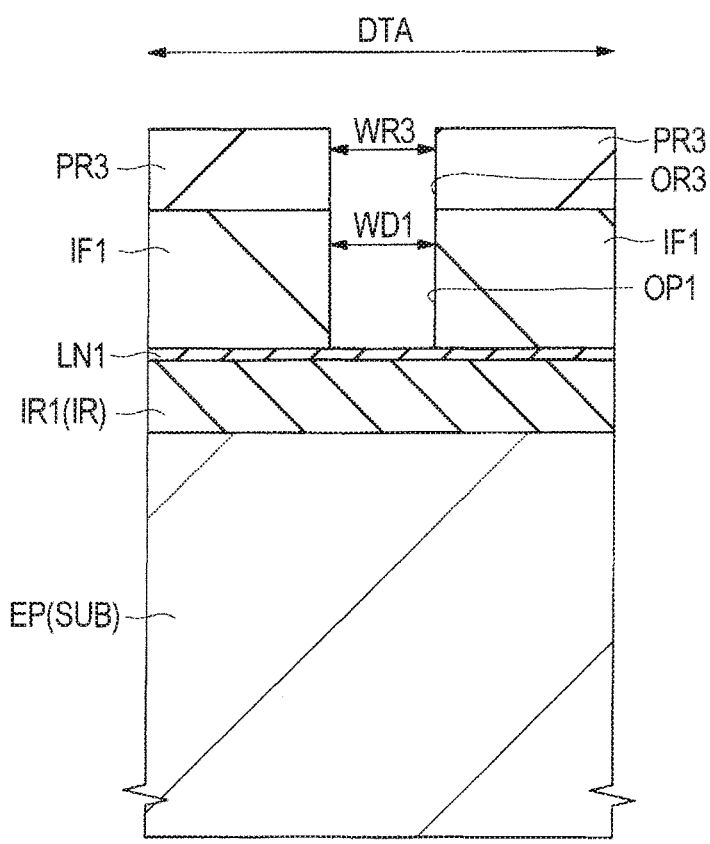
FIG. 43 is a fragmentary cross-sectional view of a semiconductor device of first modification example of Second Embodiment during a manufacturing step thereof.
Figure 44:
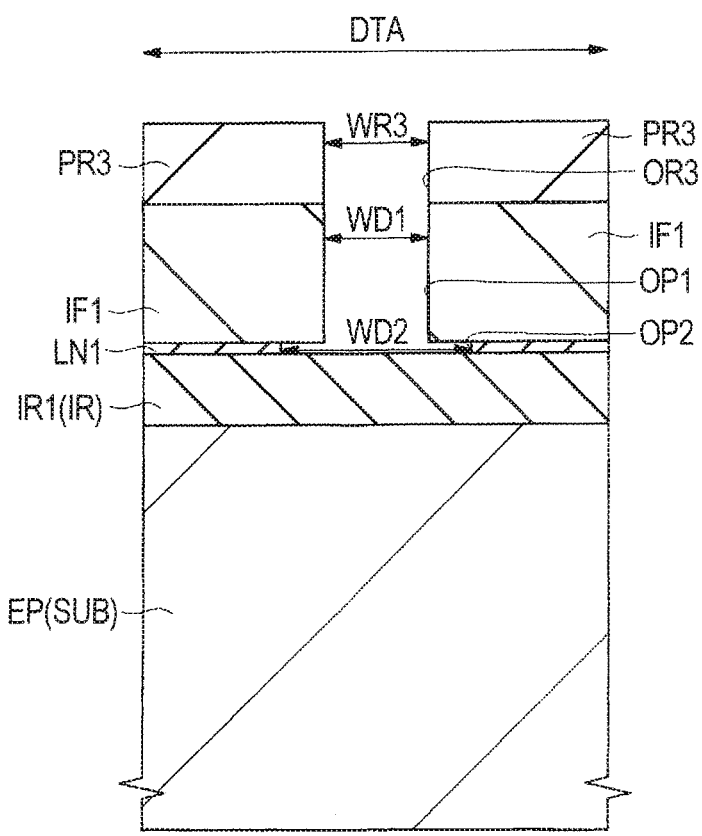
FIG. 44 is a fragmentary cross-sectional view of the semiconductor device of first modification example of Second Embodiment during a manufacturing step thereof.

FIGS. 43 and 44 are fragmentary cross-sectional views of a semiconductor device of first modification example of Second Embodiment during manufacturing steps thereof.

In the present first modification example, during formation of an opening portion OP1 by a step similar to Step S32 in FIG. 35, the resist film PR3 is not removed as shown in FIG. 43 after a portion of the insulating film IF1 exposed from the bottom surface of the opening portion OR3 is etched with the resist film PR3 having therein the opening portion OR3 as an etching mask. Therefore, as shown in FIG. 43, after formation of the opening portion OP1 penetrating through the insulating film IF1 and reaching the upper surface of the insulating film LN1, the resist film PR3 having therein the opening portion OR3 remains on the insulating film IF1 having therein the opening portion OP1.

Next, during formation of an opening portion OP2 by a step similar to Step S33 in FIG. 35, a portion of the insulating film LN1 exposed from the bottom surface of the opening portion OP1 is etched by an etching agent while using the resist film PR3 having therein the opening portion OR3 and the insulating film IF1 having therein the opening portion OP1 as etching masks. As a result, as shown in FIG. 44, an opening portion OP2 is formed which penetrates through a portion of the insulating film LN1 exposed from the bottom surface of the opening portion OP1 and reaching the upper surface of the insulating film IR1.

Next, the resist film PR3 having therein the opening portion OR3 is removed, for example, by asking. Steps similar to Steps S34 to S38 in FIG. 35 are performed as in Second Embodiment, followed by steps similar to those (Step S18 and Step S19 in FIG. 5) of First Embodiment described referring to FIGS. 29 to 31 and FIG. 4 and steps thereafter, to form the semiconductor device shown in FIG. 3.

Alternatively, after formation of the opening portion OP2, an opening portion OP3 may be formed by performing a step similar to Step S34 in FIG. 35 without removing the resist film PR3 and using, as etching masks, the resist film PR3 having therein the opening portion OR3 and the insulating film IF1 having therein the opening portion OP1. Since the upper surface of the insulating film IF1 is not etched during formation of the opening portion OP3, the insulating film IF1 used as an etching mask during formation of the trench portion TP1 can be made thicker. This method is therefore advantageous when used for forming the trench portion TP1 whose aspect ratio, that is, a ratio of depth to the trench width WD4 is high.

<Main Characteristics and Advantages of Present Embodiment>

The semiconductor device of Second Embodiment is equipped with characteristics similar to those of the semiconductor device of First Embodiment. The semiconductor device of Second Embodiment therefore has advantages similar to those of the semiconductor device of First Embodiment. For example, the closing position CP of the space SP can be lowered.

In addition, in the steps of forming the DTI structure DS in the method of manufacturing the semiconductor device according to Second Embodiment, the step of forming an opening portion by pattern exposure of a resist film is performed once. The number of steps is therefore less than that of the method of manufacturing a semiconductor device according to First Embodiment in which the step of forming an opening portion by pattern exposure of a resist film is performed twice.

In the method of manufacturing a semiconductor device in Second Embodiment, when the opening portion OP2 is formed in the insulating film LN1 made of, for example, a silicon nitride film by using an etchant containing, for example, phosphoric acid, the insulating film LN1 is etched with the insulating film IF1 having therein the opening portion OP1 as an etching mask. The opening portion OP2 is formed in alignment with the opening portion OP1. This eliminates the necessity for forming a resist film having therein an opening portion only for the formation of the opening portion OP2 and therefore eliminates the necessity for separately providing a photomask only for the formation of the opening portion OP2 and eliminates the necessity for separately performing exposure and development only for the formation of the opening portion OP2.

Compared with First Embodiment, the number of manufacturing steps of the semiconductor device can therefore be reduced. As a result, the semiconductor device can be manufactured at a reduced production cost.

In the method of manufacturing a semiconductor device according to First Embodiment, on the other hand, as shown in FIG. 17, the resist film PR1 having therein the opening portion OR1 is formed only for the formation of the opening portion OP2 so that the opening width WD2 of the opening portion OP2 can be made equal to the opening width WR1 of the opening portion OR1, for example, by anisotropic etching of the insulating film LN1. The opening width WD2 of the opening portion OP2 can be formed with improved accuracy by isotropic etching of the insulating film LN1 compared with the method of manufacturing a semiconductor device according to Second Embodiment in which the opening width WD2 of the opening portion OP2 is made greater than the opening width WD1 of the opening portion OP1.

The present invention has now been described in detail based on some embodiments. It is needless to say that the invention is not limited by these embodiments, but various changes can be made without departing from the scope of the invention.

What is claimed is:

1. A method of manufacturing a semiconductor device, comprising the steps of:
   (a) forming a first insulating film containing silicon and oxygen over the main surface of a semiconductor substrate;
   (b) forming a second insulating film over the first insulating film;
   (c) forming a first opening portion penetrating through the second insulating film and reaching the first insulating film;
   (d) forming a second opening portion penetrating through the first insulating film and reaching the semiconductor substrate in a region having therein the first opening portion in plan view;
   (e) forming a trench portion in a portion of the semiconductor substrate exposed from the second opening portion;
   (f) after the step (e), etching a portion of the first insulating film exposed from the second opening portion by a first etching agent; and
   (g) after the step (f), forming a third insulating film in the trench portion, in the second opening portion, and in the first opening portion,
   wherein an etch rate of the second insulating film by the first etching agent is smaller than an etch rate of the first insulating film by the first etching agent,
   wherein in the step (e), the trench portion is formed so as to make a trench width of the trench portion smaller than a first opening width of the first opening portion,
   wherein in the step (f), a portion of the first insulating film exposed from the second opening portion is etched by the first etching agent to make a second opening width of the second opening portion greater than the trench width of the trench portion, and
   wherein in the step (g), the trench portion is closed by the third insulating film while leaving a space in the trench portion.

2. The method of manufacturing a semiconductor device according to claim 1,
   wherein in the step (f), a portion of the first insulating film exposed from the second opening portion is etched by the first etching agent to make the second opening width of the second opening portion equal to the first opening width of the first opening portion or greater than the first opening width of the first opening portion.

3. The method of manufacturing a semiconductor device according to claim 2, further comprising the steps of:
   (h) after the step (c), forming a fourth insulating film containing silicon and oxygen over a portion of the first insulating film exposed from the first opening portion and over the second insulating film so as to fill the first opening portion; and
   (i) forming a third opening portion penetrating through the fourth insulating film and reaching the first insulating film in a region having therein the first opening portion in plan view,
   wherein an etch rate of the second insulating film by the first etching agent is smaller than an etch rate of the fourth insulating film by the first etching agent,
   wherein in the step (d), the second opening portion penetrating through a portion of the first insulating film exposed from the third opening portion and reaching the semiconductor substrate is formed, and
   wherein in the step (f), a portion of the fourth insulating film exposed from the third opening portion is etched by the first etching agent to remove the fourth insulating film in the first opening portion and expose the first insulating film, and a third opening width of the third opening portion is made equal to the first opening width of the first opening portion or made greater than the first opening width of the first opening portion.

4. The method of manufacturing a semiconductor device according to claim 2, further comprising the steps of:
   (j) after the step (b), forming a fifth insulating film containing silicon and oxygen over the second insulating film; and
   (k) forming a fourth opening portion penetrating through the fifth insulating film and reaching the second insulating film,
   wherein in the step (c), a portion of the second insulating film exposed from the fourth opening portion is etched by a second etching agent to form the first opening portion,
   wherein an etch rate of the fifth insulating film by the second etching agent and an etch rate of the first insulating film by the second etching agent are smaller than an etch rate of the second insulating film by the second etching agent,
   wherein in the step (c), the first opening portion is formed so as to make the first opening width of the first opening portion greater than a fourth opening width of the fourth opening portion, and wherein in the step (d), the first insulating film is anisotropically etched with, as a mask, the fifth insulating film having therein the fourth opening portion to form the second opening portion.

5. The method of manufacturing a semiconductor device according to claim 4, further comprising the steps of:
(l) after the step (j), forming a resist film over the fifth insulating film;
(m) by subjecting the resist film to pattern exposure and then development, forming a fifth opening portion penetrating through the resist film and reaching the fifth insulating film; and
(n) after the step (k) but before the step (c), removing the resist film,
wherein in the step (k), a portion of the fifth insulating film exposed from the fifth opening portion is etched to form the fourth opening portion.

6. The method of manufacturing a semiconductor device according to claim 4, further comprising the steps of:
(l) after the step (j), forming a resist film over the fifth insulating film;
(m) by subjecting the resist film to pattern exposure and then development, forming a fifth opening portion penetrating through the resist film and reaching the fifth insulating film; and
(n) after the step (c), removing the resist film,
wherein in the step (k), a portion of the fifth insulating film exposed from the fifth opening portion is etched to form the fourth opening portion.

7. The method of manufacturing a semiconductor device according to claim 1,
wherein the second insulating film contains silicon and nitrogen.

8. The method of manufacturing a semiconductor device according to claim 1,
wherein the first insulating film has a silicon oxide film and the second insulating film has a silicon nitride film or a silicon oxynitride film.

9. The method of manufacturing a semiconductor device according to claim 1,
wherein the first etching agent is a hydrofluoric acid-containing etchant.

* * * * *